(12) United States Patent
Taylor et al.

(10) Patent No.: US 6,410,941 B1
(45) Date of Patent: Jun. 25, 2002

(54) RECONFIGURABLE SYSTEMS USING HYBRID INTEGRATED CIRCUITS WITH OPTICAL PORTS

(75) Inventors: Michael G. Taylor, Sudbury, MA (US); Charles W. Shanley, North Barrington, IL (US); William J. Ooms, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/608,931

(22) Filed: Jun. 30, 2000

(51) Int. Cl.⁷ .................. H01L 27/15; H01L 31/12; H01L 31/153; H01L 33/00
(52) U.S. Cl. ............... 257/84; 257/79; 257/80; 257/81; 257/82; 257/441; 257/442
(58) Field of Search .............. 257/79–82, 84–85, 257/94, 103, 441, 442, 444

(56) References Cited

U.S. PATENT DOCUMENTS

| | | | |
|---|---|---|---|
| 3,766,370 A | 10/1973 | Walther | 708/494 |
| 3,802,967 A | 4/1974 | Ladany et al. | 257/183 |
| 4,006,989 A | 2/1977 | Andringa | 356/467 |
| 4,174,422 A | 11/1979 | Matthews et al. | 438/621 |
| 4,284,329 A | 8/1981 | Smith et al. | 359/484 |
| 4,297,653 A | * 10/1981 | Scifres et al. | 372/46 |
| 4,404,265 A | 9/1983 | Manasevlt | 428/689 |
| 4,482,906 A | 11/1984 | Hovel et al. | 257/190 |
| 4,484,332 A | 11/1984 | Hawrylo | 372/52 |
| 4,523,211 A | 6/1985 | Morimoto et al. | 361/807 |
| 4,661,176 A | 4/1987 | Manasevit | 117/88 |
| 4,777,613 A | 10/1988 | Shahan et al. | 708/510 |
| 4,793,872 A | 12/1988 | Meunier et al. | 148/33.4 |
| 4,802,182 A | 1/1989 | Thornton et al. | 372/50 |
| 4,815,084 A | 3/1989 | Scifres et al. | 372/46 |
| 4,846,926 A | 7/1989 | Kay et al. | 438/508 |
| 4,855,249 A | 8/1989 | Akasaki et al. | 117/95 |
| 4,876,219 A | 10/1989 | Eshita et al. | 117/90 |
| 4,882,300 A | 11/1989 | Inoue et al. | 117/91 |
| 4,891,091 A | 1/1990 | Shaslry | 117/90 |
| 4,896,194 A | 1/1990 | Suzuki | 257/200 |
| 4,912,087 A | 3/1990 | Aslam et al. | 505/475 |
| 4,928,154 A | 5/1990 | Umeno et al. | 257/190 |
| 4,963,508 A | 10/1990 | Umeno et al. | 117/90 |
| 4,963,949 A | 10/1990 | Wanlass et al. | 257/190 |
| 4,999,842 A | 3/1991 | Huang et al. | 372/45 |

(List continued on next page.)

FOREIGN PATENT DOCUMENTS

| | | |
|---|---|---|
| EP | 0 250 171 | 12/1987 |
| EP | 0 342 937 | 11/1989 |
| EP | 0 455 526 | 6/1991 |

(List continued on next page.)

OTHER PUBLICATIONS

"Integration of GaAs on Si Using A Spinel Buffer Layer", IBM Technical Bulletin, vol. 30, No. 6, Nov. 1987, p. 365.
"GaInAs Superconducting FET," IBM Technical Bulletin, vol. 36, No. 8, Aug. 1993, p. 655–656.

(List continued on next page.)

*Primary Examiner*—Minh Loan Tran
*Assistant Examiner*—Thomas L. Dickey
(74) *Attorney, Agent, or Firm*—Oblon, Spivak, McClelland, Maier & Neustadt, P.C.

(57) ABSTRACT

A hybrid integrated circuit is provided that has a monocrystalline substrate such as silicon and a compound semiconductor layer such as gallium arsenide or indium phosphide. An optical communications port may be formed on the hybrid integrated circuit. Electrical equipment may be provided that includes electrical components. At least a given one of the components may be a hybrid integrated circuit. Data used for the operation of one of the given integrated circuit may be provided to the given integrated circuit through the optical communications port on that integrated circuit. The data may be loaded rapidly in real time due to the wide bandwidth of the optical communications port.

33 Claims, 18 Drawing Sheets

U.S. PATENT DOCUMENTS

| | | | |
|---|---|---|---|
| 5,060,031 A | 10/1991 | Abrokwah et al. | 257/274 |
| 5,063,166 A | 11/1991 | Mooney et al. | 438/506 |
| 5,081,062 A | 1/1992 | Vasudev et al. | 438/412 |
| 5,116,461 A | 5/1992 | Lebby et al. | 216/2 |
| 5,127,067 A | 6/1992 | Delcoco et al. | 385/24 |
| 5,141,894 A | 8/1992 | Bisaro et al. | 438/479 |
| 5,144,409 A | 9/1992 | Ma | 257/557 |
| 5,155,858 A | 10/1992 | Inam et al. | 365/145 |
| 5,159,413 A | 10/1992 | Calviello et al. | 505/191 |
| 5,173,474 A | 12/1992 | Connell et al. | 505/330 |
| 5,221,367 A | 6/1993 | Ward et al. | 348/180 |
| 5,225,031 A | 7/1993 | McKee et al. | 428/471 |
| 5,248,564 A | 9/1993 | Ramesh | 428/688 |
| 5,270,298 A | 12/1993 | Ramesh | 505/238 |
| 5,286,985 A | 2/1994 | Taddiken | 257/200 |
| 5,293,050 A | 3/1994 | Chapple-Sokol et al. | 257/17 |
| 5,310,707 A | 5/1994 | Oishi et al. | 501/126 |
| 5,326,721 A | 7/1994 | Summerfelt | 438/3 |
| 5,356,831 A | 10/1994 | Calviello et al. | 117/105 |
| 5,358,925 A | 10/1994 | Connell et al. | 505/235 |
| 5,391,515 A | 2/1995 | Kao et al. | 438/509 |
| 5,393,352 A | 2/1995 | Summerfelt | 117/89 |
| 5,404,581 A | 4/1995 | Honjo | 455/90 |
| 5,418,216 A | 5/1995 | Fork et al. | 505/423 |
| 5,418,389 A | 5/1995 | Watanabe | 257/295 |
| 5,436,759 A | 7/1995 | Dijali et al. | 359/333 |
| 5,444,016 A | 8/1995 | Abrokwah et al. | 438/520 |
| 5,450,812 A | 9/1995 | McKee et al. | 117/84 |
| 5,478,653 A | 12/1995 | Guenzer | 428/446 |
| 5,480,829 A | 1/1996 | Abrokwah et al. | 438/169 |
| 5,482,003 A | 1/1996 | McKee et al. | 117/108 |
| 5,514,484 A | 5/1996 | Nashimoto | 428/700 |
| 5,528,414 A | 6/1996 | Oakley | 359/257 |
| 5,556,463 A | 9/1996 | Guenzer | 117/90 |
| 5,576,879 A | 11/1996 | Nashimoto | 359/248 |
| 5,588,995 A | 12/1996 | Sheldon | 117/201 |
| 5,606,184 A | 2/1997 | Abrokwah et al. | 257/192 |
| 5,614,739 A | 3/1997 | Abrokwah et al. | 257/192 |
| 5,640,267 A | 6/1997 | May et al. | 359/322 |
| 5,670,798 A | 9/1997 | Schetzina | 257/96 |
| 5,674,366 A | 10/1997 | Hayashi et al. | 204/298.09 |
| 5,729,394 A * | 3/1998 | Sevier et al. | 359/726 |
| 5,729,641 A | 3/1998 | Chandonnet al. | 385/2 |
| 5,731,220 A | 3/1998 | Tsu et al. | 438/382 |
| 5,733,641 A | 3/1998 | Fork et al. | 428/210 |
| 5,735,949 A | 4/1998 | Mantl et al. | 113/8 |
| 5,741,724 A | 4/1998 | Ramdani et al. | 438/46 |
| 5,764,676 A * | 6/1998 | Paoli et al. | 372/50 |
| 5,777,762 A | 7/1998 | Yamamoto | 359/123 |
| 5,778,018 A * | 7/1998 | Yoshikawa et al. | 372/45 |
| 5,778,116 A | 7/1998 | Tomich | 385/16 |
| 5,790,583 A | 8/1998 | Ho | 372/92 |
| 5,801,105 A | 9/1998 | Yano et al. | 438/785 |
| 5,810,923 A | 9/1998 | Yano et al. | 117/84 |
| 5,825,799 A | 10/1998 | Ho et al. | 372/92 |
| 5,828,080 A | 10/1998 | Yano et al. | 257/43 |
| 5,830,270 A | 11/1998 | McKee et al. | 117/106 |
| 5,857,049 A | 1/1999 | Beranek et al. | 385/91 |
| 5,858,814 A * | 1/1999 | Goossen et al. | 438/107 |
| 5,861,966 A | 1/1999 | Ortel | 359/125 |
| 5,874,860 A | 2/1999 | Brunel et al. | 330/285 |
| 5,883,996 A | 3/1999 | Knapp et al. | 385/88 |
| 5,912,068 A | 6/1999 | Jia | 428/210 |
| 5,926,496 A | 7/1999 | Ho et al. | 372/92 |
| 5,937,285 A | 8/1999 | Abrokwah et al. | 438/172 |
| 5,981,400 A | 11/1999 | Lo | 438/745 |
| 5,990,495 A | 11/1999 | Ohba | 257/94 |
| 5,995,359 A | 11/1999 | Klee et al. | 361/305 |
| 6,002,375 A | 12/1999 | Corman et al. | 343/853 |
| 6,020,222 A | 2/2000 | Wollesen | 438/149 |
| 6,045,626 A | 4/2000 | Yano et al. | 148/33.4 |
| 6,055,179 A | 4/2000 | Koganel et al. | 365/158 |
| 6,058,131 A | 5/2000 | Pan | 352/105 |
| 6,064,078 A | 5/2000 | Northrup et al. | 257/96 |
| 6,064,092 A | 5/2000 | Park | 257/347 |
| 6,096,584 A | 8/2000 | Ellis-Monaghan et al. | 438/151 |
| 6,103,008 A | 8/2000 | McKee et al. | 117/2 |
| 6,107,653 A | 8/2000 | Fitzgerald | 257/318 |
| 6,113,690 A | 9/2000 | Yu et al. | 117/84 |
| 6,121,642 A | 9/2000 | Newns | 257/192 |
| 6,128,178 A | 10/2000 | Newns | 361/305 |
| 6,136,666 A | 10/2000 | So | 438/458 |
| 6,137,603 A | 10/2000 | Henmi | 359/110 |
| 6,143,072 A | 11/2000 | McKee et al. | 117/108 |
| 6,146,906 A | 11/2000 | Inoue et al. | 438/3 |
| 6,150,188 A * | 11/2000 | Geusic et al. | 438/31 |
| 6,174,755 B1 | 1/2001 | Manning | 438/151 |
| 6,180,252 B1 | 1/2001 | Farrell et al. | 428/469 |
| 6,180,486 B1 | 1/2001 | Leobandung et al. | 438/405 |
| 6,181,856 B1 * | 1/2001 | Brun | 385/52 |
| 6,184,144 B1 | 2/2001 | Lo | 438/703 |
| 6,222,654 B1 | 4/2001 | Frigo | 359/119 |

FOREIGN PATENT DOCUMENTS

| | | |
|---|---|---|
| EP | 0 514 018 | 11/1992 |
| EP | 0 602 568 | 6/1994 |
| EP | 0 607 435 | 7/1994 |
| EP | 0 999 600 | 5/2000 |
| EP | 1 001 468 | 5/2000 |
| GB | 1 319 311 | 6/1970 |
| GB | 2 335 792 | 9/1999 |
| JP | 52-88354 | 7/1977 |
| JP | 54-134554 | 10/1979 |
| JP | 55-87424 | 7/1980 |
| JP | 61-108187 | 5/1986 |
| JP | 63-34994 | 2/1988 |
| JP | 63-131104 | 6/1988 |
| JP | 63-198365 | 8/1988 |
| JP | 2-391 | 1/1990 |
| JP | 63-278629 | 1/1990 |
| JP | 5-48072 | 2/1993 |
| JP | 6-232126 | 8/1994 |
| JP | 6-291299 | 10/1994 |
| JP | 6-33 4168 | 12/1994 |
| JP | 5-291299 | 11/1998 |
| JP | 10-321943 | 12/1998 |
| JP | 10321943 A * | 12/1998 |
| JP | 11-238683 | 8/1999 |
| JP | 11-260835 | 9/1999 |
| WO | WO 97345827 | 12/1997 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 00/33363 | 6/2000 |
| WO | WO 00/48239 | 8/2000 |

OTHER PUBLICATIONS

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SiTiO_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Sl Interlayers in situ Annealed at High Temperatures, *8257b Journal of Vacuum Science & Technology*, May/Jun. 1995, vol. 13, No. 3, pp. 1000–1005.

Cuomo et al., "Substrate Effect on the Superconductivity of $YBa_2Cu_3O_7$ Thin Films," AIP Conference 1988, pp. 141–148.

McKee et al., "Crystalline Oxides on Silicon: The First Five Monolayers," *Physical Review Letters,* vol. 81, No. 14, Oct. 1998, pp. 3014–3017.

McKee et al., "Molecular Beam Epitaxy Growth of Epitaxial Barium Silicide, Oxide, and Barium Titanate on Silicon," *1991 American Institute of Physics,* pp. 782–784, Aug. 13, 1991.

Tambo et al., Molecular Beam Epitaxy Growth of $SrTiO_3$ Films on Sl(100)–2x1 with SrO Buffer Layer, *Jpn. J. Appl. Phys.,* vol. 37, 1998, pp. 4454–4459.

McKee et al., "The MBE Growth and Optical Quality of $BaTiO_3$ and $SrTiO_3$ Thin Films on MgO," *Mat. Res. Soc. Symp. Proc.,* vol. 341, Apr. 1994, pp. 309–314.

McKee et al., "$BaSi_2$ and Thin Film Alkaline Earth Silicides on Silicon," *Appl. Phys. Lett.* 63(20), Nov. 1993, pp. 2818–2820.

McKee et al., "Surface Structures and the Orthornombic Transformation of Thin Film $BaSl_2$ on Silicon," *Mat. Res. Soc. Symp. Proc.,* vol. 221, pp. 131–136, 1991.

Mori et al., "Epitaxial Growth of $SrTiO_3$ Films on Sl(100) Substrates Using a Focused Electron Beam Evaporation Method," *Jpn. J. of Apl. Phys.,* vol. 30, No. 8A, Aug. 1991, pp. L1415–L1417.

Moon et al., "Growth of Crystalline $SrTiO_3$ Films on Sl Substrates Using Thin Fluoride Buffer Layers and Their Electrical Properties," *Jpn. J. of Appl. Phys.,* vol. 33, (1994), pp. 5911–5916.

Farrow et al., "Heteroepitaxy of Dissimilar Materials," *Mat. Res. Soc. Symposium Proceedings,* vol. 221, pp. 29–34, Apr. 29–May 2, 1991.

Chol et al., "Heteroepitaxy on Silicon: Fundamentals, Structure, and Devices," *Mat. Res. Soc.,* Symposium Proceedings, vol. 116, pp. 369–374, Apr. 5–8, 1988.

H. Nagata, "A Preliminary Consideration of the Growth Behavior of $CeO_2$, $SrTiO_3$, and $SrVO_3$ Films on Si Substrate," *Thin Solid Films,* 224, 1993, pp. 1–3.

Nagata et al., "Heteroepitaxial Growth of $CeO_2$(001) Films on Si(001) Substrates by Pulsed Laser Deposition in Ultrahigh Vacuum," *Jpn. Jour. Appl. Phys.,* vol. 30, No. 6B, Jun. 1991, pp. L1136–L1138.

Kado et al., "Heteroepitaxial Growth of SrO Films on Sl Substrates," *J. Appl. Phys.,* 61(6), Mar. 15, 1987, pp. 2398–2400.

Bean et al., "Silicon Molecular Beam Epitaxy," *Materials Research Symposium Proceedings,* vol. 220, pp. 595–600, Apr. 29–May 3, 1991.

Nakagawara et al., Effects of Buffer Layers in Epitaxial Growth of $SrTiO_3$ Thin Film on Sl(100), *J. Appl. Phys.,* 78 (12), Dec. 15, 1995, pp. 7226–7230.

Suzuki et al., "A Proposal of Epitaxial Oxide Thin Film Structures For Future Oxide Electronics," *Materials Science an Engineering B41,* (1996), pp. 166–173.

W. F. Egelhoff et al., "Optimizing GMR Spin Valves: The Outlook for Improved Properties", 1998 Int'l Non Volatile Memory Technology Conference, pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Accoustoelectric Interactions In $GaAs/LINbO_3$ Structures",*Applied Physics Letters,* vol. 75(7), Aug. 16, 1999, pp. 965–967.

K. Sreenlvas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto-–Electric and Acousto–Optic Applications," *1997 Applied Physics Letters,* vol. 70(16), Apr. 21, 1997, pp. 2097–2099.

A. Mansingh et al., "Surface Acoustic Wave Propagation in $PZT/YBCO/SrTiO_3$ and $PbTiO_3/YBCO/SrTiO_3$ Epitaxial Heterostructures," *Ferroelectric,* vol. 224, pp. 275–282, 1999.

S. Mathews et al., "Ferroelectric Field Effect Transistor Based on Epitaxial Heterostructures", Science, vol. 276, Apr. 11, 1997, pp. 238–240.

R. Houdre et al., "Properties of GaAs on Si Grown by Molecular Beam Epitaxy," *Solid State and Materials Sciences,* vol. 16, Issue 2, 1990, pp. 91–114.

S. F. Fang et al., "Gallium Arsenide and Other Compound Semiconductors on Silicon," *J. Appl. Phys.,* 68(7), Oct. 1, 1990, pp. R31–R58.

Carlin et al., Impact of GaAs Buffer Thickness on Electronic Quality of GaAs Grown on Graded Ga/GaSi/Sl Substrates, *Appl. Phys. Letter,* vol. 76, No. 14, Apr. 2000, pp. 1884–1886.

Ringel et al., "Epitaxial Integration of III–V Materials and Devices with Sl Using Graded GeSi Buffers," 27th International Symposium on Compound Semiconductors, Oct. 2000.

Zogg et al., "Progress In Compound–Semiconductor–on-–Silicon–Heteroepitaxy with Fluoride Buffer Layers," *J. Electrochem. Soc.,* vol. 136, No. 3, Mar. 1996, pp. 775–779.

Xiong et al., "Oxide Defined in GaAs Vertical–Cavity Surface–Emitting Lasers on Sl Substrates," *IEEE Photonics Technology Letters,* vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.,* vol. 541, pp. 661–666, 1999.

Gunapala et al., "Bound–To–Quasi–Bound Quantum–Well Infrared Photodetectors," NASA Tech Brief, vol. 22, No. 9, Sep. 1996.

Bruley et al., "Nanostructure and Chemistry of a (100)MgO/(100) GaAs Interface," *Appl. Phys. Lett,* 65(5), Aug. 1994, pp. 564–566.

Fork et al., "Epitaxial MgO On Si(001) for Y—Ba—Cu—O Thin Film Growth by Pulsed Laser Deposition," *Appl. Phys. Lett.,* 58(20), May 20, 1991, pp. 2294–2296.

Himpsel et al., "Dialectrics on Semiconductors," *Materials Science and Engineering,* B1(1988), pp. 9–13.

Li et al., "Epitaxial $La_{0.67}Sr_{0.33}$ $MnO_3$ Magnetic Tunnel Junctions," *J. Appl. Phys.* 81(8), Apr. 15, 1997, pp. 6509–6511.

O'Donnell et al., "Colossal Magneticresistance Magnetic Tunnel Junctions Grown by Molecular–Beam Epitaxy," *Appl. Physics Letters,* vol. 76, No. 14, Apr. 3, 2000, pp. 1914–1916.

Mikami et al., "Formation of Si $Epi/MgO—Al_2O_3Epi/SiO_3/$Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of $CaF_2$ and Silicon," *Thin Solid Films,* vol. 93 (1982), pp. 143–150.

T. Chikyow et al., "Reaction and Regrowth Control of CaO$_2$ on Si(111) Surface for the Silicon–On–Insulator Structure," *Appl. Phys. Lett.,* vol. 65, No. 8, Aug. 22, 1994, pp. 1030–1032.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Ronald W. Waynant, et al.; "Optoelectronic Integrated Circuits", Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D. A. Francis, et al; "A single–chip linear optical amplifier"; OFC, 2001; Mar. 17–22, 2001.

Brian A. Floyd, et al.; "The projected Power Consumption of a Wireless Clock Distribution System and Comparison to Conventional Distribution Systems"; IEEE, 1999; pp. IITC99–249–IITC99–250.

Jo–Ey Wong, et al.; "An Electrostatically–Actuated Mems Switch For Power Applications"; IEEE, 2000, pp. 633–638.

T. Mizuno, et al.; "Electron and Hole Mobility Enhancement in Strained –Si MOSFET's on SiGe–on–Insulator Substrates Fabricated by SIMOX Technology"; IEEE Electron Device Letters, vol. 21, No. 5, May 2000; pp. 230–232.

F. M. Buffer, et al.; "Strain–dependence of electron transport in bulk Si and deep–submicron MOSFET's"Computatural Electronics, 2000, Book of Abstracts, IWCE Glasgow 2000, $7^{th}$Int'l Workshop on, 2000; pp. 64–65.

S. S. Lu, et al.; "Piezoelectric field effect transistor (PEFET) using $In_{0.2}Ga_{0.8}As/Al_{0.35}Ga_{0.65}As/In_{0.2}Ga_{0.8}As/GaAs$ Strained layer structure on (111)B GaAs substrate"; Electronics Letters, $12^{th}$ Ma 1994, vol. 30, No. 10; pp. 823–825.

Kihong Kim, et al."On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna", 1998 IEEE MTT–S Digest; pp. 305–308.

Mau–Chung Frank Chang, et al.; "RF/Wireless Interconnect for Inter–and Intra–Chip Communications"; Proceedings of the IEEE, vol, 89, No. 4, Apr. 2001; pp. 456–466.

The Electronics Industry Report; Prismark, 2001; pp. 111–120.

J. K. Abrokwah, et al.; "A Manufacturable Complementary GaAs Process"; GaAs IC Sysmposium, IEEE, 1993; pp. 127–130.

J. K. Abrokwah, et al.; "A Manufacturable High–Speed Low–Power Complementary GaAs Process", Extended Abstracts of the 1994 International Conference on Solid State Devices and Materials, Yokohama, 1994, pp. 592–594.

Leonard J. Brillson; "Stable and Epitaxial Contacts to III–V Compound Semiconductors"; Semiconductors Fundamentals and Technology; Noyles Publications, 1993; pp. 67–150.

Jayshri Sabarinathat, et al.; "Submicron three–dimensional infrared GaAs/Al$_x$O$_y$–based photonic crystal using single–step epitaxial growth", Applied Physics Letters, vol. 78, No. 20, May 14, 2001; pp. 3024–3026.

Philip Ball; "The Next Generation of Optical Fibert"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime –past, present and future"; Progress in Quantum Electronics 23 (1999) 51–96.

G. H. Jin, et al.; "PLZT Film Waveguide Mach–Zehnder ELectrooptic Modulator"; Journal of Lightwave Technology, vol. 18, No. 6. Jun. 2000; pp. 807–812.

D. E. Aspnes, et al.; "Steps on (001) silicon surfaces"; J. Vac. Sci. Technol. B, vol. 5, No. 4, Jul./Aug. 1987; pp. 939–944.

D. M. Newns, et al.; "Mott transition field effect transistor"; Applied Physics Letters, vol. 73, No. 6, 10 Aug. 1998; pp. 780–782.

Lucent Technologies, Inc. "Arrayed Waveguide Grating Multiplexer/Demultiplexer"; Jan. 2000; 4 pages.

Hisashi Shichijo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium –239–242.

H. Shichijo, et al.; "Monolithic Process for Co–Integration of GaAs and Silicon Circuits", 1988 IEEE; pp. 778–781.

Z. H. Zhu, et al. "Growth of InGaAs multi–quantum wells at 1.3$\mu$m wavelength on GaAs compliant substrates"; Applied Physics Letters, vol. 72, No. 20, May 18, 1998; pp. 2598–2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three Terminal Tandem Solar Cells With a Back–Contact Type Bottom Cell" Higashifuji Technical Center, Toyota Motor Corporation; 4 pages, undated.

James Schellenberg, et al.; "Low–Loss, Planar Monolithic Baluns for K/Ka–Band Applications"; 1999 IEEE MTT–S Digest; pp. 1733–1736.

Patent Abstracts of Japan, vol. 010, No. 289, Oct. 2, 1986 & JP 61 108187, May 26, 1986.

Patent Abstracts of Japan, vol. 017, No. 344 & JP 05 048072, Feb. 26, 1993.

Patent Abstracts of Japan, vol. 1999, No. 14, Dec. 22, 1999 & JP 11 260835, Sep. 24, 1999.

Patent Abstracts of Japan, vol. 012, No. 388, Oct. 17, 1988 & JP 63 131104, Jun. 3, 1988.

Patent Abstracts of Japan, vol. 012, No. 246, Jul. 12, 1988 & JP 63 034994, Feb. 15, 1988.

Patent Abstracts of Japan, vol. 012, No. 077, Mar. 10, 1988 & JP 62 216600, Sep. 24, 1987.

R. D. Vispute; "High quality optioelectronic grade epitaxial AIN films on $\alpha$–Al$_2$O$_3$Si and 6H–SiC by pulsed laser deposition"; Thin Solid Films 299 (1997), pp. 94–103.

T. Warren Weeks, et al.; "GaN thin films deposited via organometallic vapor phase epitaxy on $\alpha$(6H)–SiC(0001) using high–temperature Monocyrstalline AIN buffer layers"320 Applied Physics Letters, vol. 67, No. 3, Jul. 17 1995, pp. 1401–403.

Z. Yu, et al.; "Epitaxial oxide thin films on SI(001)*"; J. Vac. Sci. Technol. B. vol. 18, No. 4, Jul./Aug./ 2000; pp. 2139–2145.

Patent Abstracts of Japan, vol. 015, No. 098, Mar. 8, 1991 & JP 02 306680. Dec. 20, 1990.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M. A. Herman, et al.; "Molecular Beam Epitaxy Fundamentals and Current Status"; Springer–Verlag Berlin Heidelberg, 1989, 1996.

Douglas B. Chrisey, et al; Pulsed Laser Deposition of Thin Films; pp. 273–285.

B. A. Block, et al.; "Photoluminescence properties of $Er^3$–doped $BaTiO_3$ thin films"; Appl. Phys. Lett. 65 (1), Jul. 4, 1994, pp. 25–27.

Gentex Corporate Website; Photoelectric Smoke Detectors –How They Work; 2001.

Jeffrey B. Casady, et al.; "A Hybrid 6H–SiC Temperature Sensor Operational from 25°C to 500°C"; IEEE Transactions on Components, Packaging, and Manufacturing Technology –Part A, vol. 19, No. 3, Sep. 1996; pp. 416–422.

* cited by examiner

RECONFIGURABLE SYSTEMS USING HYBRID INTEGRATED CIRCUITS WITH OPTICAL PORTS

BACKGROUND OF THE INVENTION

Systems often contain logic or other circuitry that is reconfigured by loading new data and instructions. For example, in a typical computer system, application software is loaded into memory from hard-disk storage before it may be run on the computer's microprocessor. Digital signal processors, programmable logic devices, application specific circuits, and other logic and processing devices may also be reconfigured before or at run time by loading desired data and instructions.

A problem with traditional electronic systems is that the bandwidth of the input/output (I/O) circuitry used to supply devices with new data and instructions may be fairly limited. Traditional electronic systems with high-bandwidth I/O capabilities may use I/O arrangements that are high in cost or that are quite complex.

Skilled artisans will appreciate that in many cases elements in certain FIGS. are illustrated for simplicity and clarity and have not necessarily been drawn to scale. For example, the dimensions of some of the elements in certain FIGS. may be exaggerated relative to other elements to help to improve understanding of what is being shown.

DETAILED DESCRIPTION OF THE DRAWINGS

The present invention involves semiconductor structures of particular types. For convenience herein, these semiconductor structures are sometimes referred to as "composite semiconductor structures" or "composite integrated circuits"

because they include two (or more) significantly different types of semiconductor devices in one integrated structure or circuit. For example, one of these two types of devices may be silicon-based devices such as CMOS devices, and the other of these two types of devices may be compound semiconductor devices such GaAs devices. Illustrative composite semiconductor structures and methods for making such structures are disclosed in Ramdani et al. U.S. patent application Ser. No. 09/502,023, filed Feb. 10, 2000, which is hereby incorporated by reference herein in its entirety. Certain material from that reference is substantially repeated below to ensure that there is support herein for references to composite semiconductor structures and composite integrated circuits.

Figure 1:
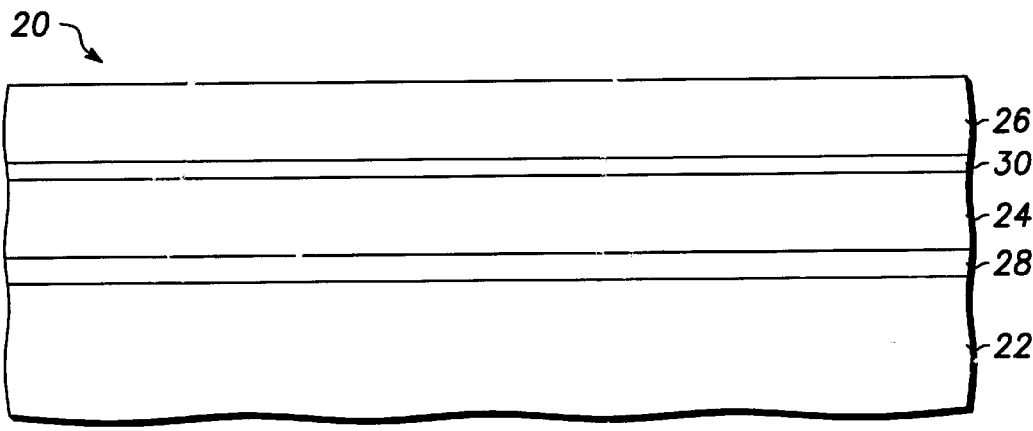
FIGS. 1, 2, 3, 9, 10 illustrate schematically, in cross section, device structures that can be used in accordance with various embodiments of the invention.

FIG. 1 illustrates schematically, in cross section, a portion of a semiconductor structure 20 which may be relevant to or useful in connection with certain embodiments of the present invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment, structure 20 also includes an amorphous intermediate layer 28 positioned between substrate 22 and accommodating buffer layer 24. Structure 20 may also include a template layer 30 between accommodating buffer layer 24 and compound semiconductor layer 26. As will be explained more fully below, template layer 30 helps to initiate the growth of compound semiconductor layer 26 on accommodating buffer layer 24. Amorphous intermediate layer 28 helps to relieve the strain in accommodating buffer layer 24 and by doing so, aids in the growth of a high crystalline quality accommodating buffer layer 24.

Substrate 22, in accordance with one embodiment, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate 22. In accordance with one embodiment, amorphous intermediate layer 28 is grown on substrate 22 at the interface between substrate 22 and the growing accommodating buffer layer 24 by the oxidation of substrate 22 during the growth of layer 24. Amorphous intermediate layer 28 serves to relieve strain that might otherwise occur in monocrystalline accommodating buffer layer 24 as a result of differences in the lattice constants of substrate 22 and buffer layer 24. As used herein, lattice constant refers to the distance between atoms of a cell measured in the plane of the surface. If such strain is not relieved by amorphous intermediate layer 28, the strain may cause defects in the crystalline structure of accommodating buffer layer 24. Defects in the crystalline structure of accommodating buffer layer 24, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with underlying substrate 22 and with overlying compound semiconductor material 26. For example, the material could be an oxide or nitride having a lattice structure matched to substrate 22 and to the subsequently applied semiconductor material 26. Materials that are suitable for accommodating buffer layer 24 include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for accommodating buffer layer 24. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template 30 materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:

FIG. 2 illustrates, in cross section, a portion of a semiconductor structure 40 in accordance with a further embodiment. Structure 40 is similar to the previously described semiconductor structure 20 except that an additional buffer layer 32 is positioned between accommodating buffer layer 24 and layer of monocrystalline compound semiconductor material 26. Specifically, additional buffer layer 32 is positioned between the template layer 30 and the overlying layer 26 of compound semiconductor material. Additional buffer layer 32, formed of a semiconductor or compound semiconductor material, serves to provide a lattice compensation when the lattice constant of accommodating buffer layer 24 cannot be adequately matched to the overlying monocrystalline compound semiconductor material layer 26.

Figure 3:
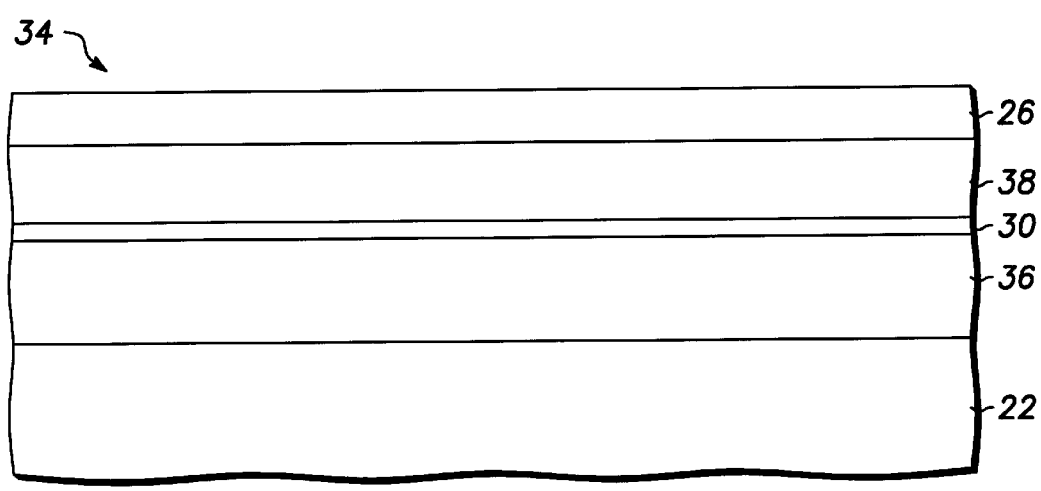

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional semiconductor layer 38.

As explained in greater detail below, amorphous layer 36 may be formed by first forming an accommodating buffer layer and an amorphous interface layer in a similar manner to that described above. Monocrystalline semiconductor layer 26 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and semiconductor layer 38 (subsequent to layer 38 formation) relieves stresses between layers 22 and 38 and provides a true compliant substrate for subsequent processing—e.g., compound semiconductor layer 26 formation.

The processes previously described above in connection with FIGS. 1 and 2 are adequate for growing monocrystalline compound semiconductor layers over a monocrystalline substrate. However, the process described in connection with FIG. 3, which includes transforming a monocrystalline accommodating buffer layer to an amorphous oxide layer, may be better for growing monocrystalline compound semiconductor layers because it allows any strain in layer 26 to relax.

Semiconductor layer 38 may include any of the materials described throughout this application in connection with either of compound semiconductor material layer 26 or additional buffer layer 32. For example, layer 38 may include monocrystalline Group IV or monocrystalline compound semiconductor materials.

In accordance with one embodiment of the present invention, semiconductor layer 38 serves as an anneal cap during layer 36 formation and as a template for subsequent semiconductor layer 26 formation. Accordingly, layer 38 is preferably thick enough to provide a suitable template for layer 26 growth (at least one monolayer) and thin enough to allow layer 38 to form as a substantially defect free monocrystalline semiconductor compound.

In accordance with another embodiment of the invention, semiconductor layer 38 comprises compound semiconductor material (e.g., a material discussed above in connection with compound semiconductor layer 26) that is thick enough to form devices within layer 38. In this case, a semiconductor structure in accordance with the present invention does not include compound semiconductor layer 26. In other words, the semiconductor structure in accordance with this embodiment only includes one compound semiconductor layer disposed above amorphous oxide layer 36.

The layer formed on substrate 22, whether it includes only accommodating buffer layer 24, accommodating buffer layer 24 with amorphous intermediate or interface layer 28, or an amorphous layer such as layer 36 formed by annealing layers 24 and 28 as described above in connection with FIG. 3, may be referred to generically as an "accommodating layer."

The following non-limiting, illustrative examples illustrate various combinations of materials useful in structures 20, 40 and 34 in accordance with various alternative embodiments. These examples are merely illustrative, and it is not intended that the invention be limited to these illustrative examples.

EXAMPLE 1

In accordance with one embodiment, monocrystalline substrate 22 is a silicon substrate oriented in the (100) direction. Silicon substrate 22 can be, for example, a silicon substrate as is commonly used in making complementary metal oxide semiconductor (CMOS) integrated circuits having a diameter of about 200–300 mm. In accordance with this embodiment, accommodating buffer layer 24 is a monocrystalline layer of $Sr_zBa_{1-z}TiO_3$ where z ranges from 0 to 1 and amorphous intermediate layer 28 is a layer of silicon oxide ($SiO_x$) formed at the interface between silicon substrate 22 and accommodating buffer layer 24. The value of z is selected to obtain one or more lattice constants closely matched to corresponding lattice constants of the subsequently formed layer 26. Accommodating buffer layer 24 can have a thickness of about 2 to about 100 nanometers (nm) and preferably has a thickness of about 10 nm. In general, it is desired to have an accommodating buffer layer 24 thick enough to isolate compound semiconductor layer 26 from substrate 22 to obtain the desired electrical and optical properties. Layers thicker than 100 nm usually provide little additional benefit while increasing cost unnecessarily; however, thicker layers may be fabricated if needed. The amorphous intermediate layer 28 of silicon oxide can have a thickness of about 0.5–5 nm, and preferably a thickness of about 1.5–2.5 nm.

In accordance with this embodiment, compound semiconductor material layer 26 is a layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer 30 is formed by capping the oxide layer. Template layer 30 is preferably 1–10 monolayers of Ti—As, Sr—O—As, Sr—Ga—O, or Sr—Al—O. By way of a preferred example, 1–2 monolayers 30 of Ti—As or Sr—Ga—O have been shown to successfully grow GaAs layers 26.

EXAMPLE 2

In accordance with a further embodiment, monocrystalline substrate 22 is a silicon substrate as described above. Accommodating buffer layer 24 is a monocrystalline oxide of strontium or barium zirconate or hafnate in a cubic or orthorhombic phase with an amorphous intermediate layer 28 of silicon oxide formed at the interface between silicon substrate 22 and accommodating buffer layer 24. Accommodating buffer layer 24 can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate 22 silicon lattice structure.

An accommodating buffer layer 24 formed of these zirconate or hafnate materials is suitable for the growth of compound semiconductor materials 26 in the indium phosphide (InP) system. The compound semiconductor material 26 can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 µm. A suitable template 30 for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—C—P), and preferably 1–2 monolayers of one of these materials. By way of an example, for a barium zirconate accommodating buffer layer 24, the surface is terminated with 1–2 monolayers of zirconium followed by deposition of 1–2 monolayers of arsenic to form a Zr—As template 30. A monocrystalline layer 26 of the compound semiconductor material from the indium phosphide system is then grown on template layer 30. The resulting lattice structure of the compound semiconductor material 26 exhibits a 45 degree rotation with respect to the accommodating buffer layer 24 lattice structure and a lattice mismatch to (100) InP of less than 2.5%, and preferably less than about 1.0%.

EXAMPLE 3

In accordance with a further embodiment, a structure is provided that is suitable for the growth of an epitaxial film of a II–VI material overlying a silicon substrate 22. The substrate 22 is preferably a silicon wafer as described above. A suitable accommodating buffer layer 24 material is $Sr_xBa_{1-x}TiO_3$, where x ranges from 0 to 1, having a thickness of about 2–100 nm and preferably a thickness of about 5–15 nm. The II–VI compound semiconductor material 26 can be, for example, zinc selenide (ZnSe) or zinc sulfur selenide (ZnSSe). A suitable template 30 for this material system includes 1–10 monolayers of zinc-oxygen (Zn—O) followed by 1–2 monolayers of an excess of zinc followed by the selenidation of zinc on the surface. Alternatively, a template 30 can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying compound semiconductor material. The compositions of other materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline compound semiconductor material layer. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between accommodating buffer layer 24 and overlying monocrystalline compound semiconductor material layer 26. Buffer layer 32, a further monocrystalline semiconductor material, can be, for example, a graded layer of indium gallium arsenide (InGaAs) or indium aluminum arsenide (InAlAs). In accordance with one aspect of this embodiment, buffer layer 32 includes InGaAs, in which the indium composition varies from 0 to about 47%. Buffer layer 32 preferably has a thickness of about 10–30 nm. Varying the composition of buffer layer 32 from GaAs to InGaAs serves to provide a lattice match between the underlying monocrystalline oxide material 24 and the overlying layer 26 of monocrystalline compound semiconductor material. Such a buffer layer 32 is especially advantageous if there is a lattice mismatch between accommodating buffer layer 24 and monocrystalline compound semiconductor material layer 26.

EXAMPLE 6

This example provides exemplary materials useful in structure 34, as illustrated in FIG. 3. Substrate material 22, template layer 30, and monocrystalline compound semiconductor material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa1-z TiO3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of semiconductor material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline compound semiconductor material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of accommodating buffer layer 24 and monocrystalline substrate 22 must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
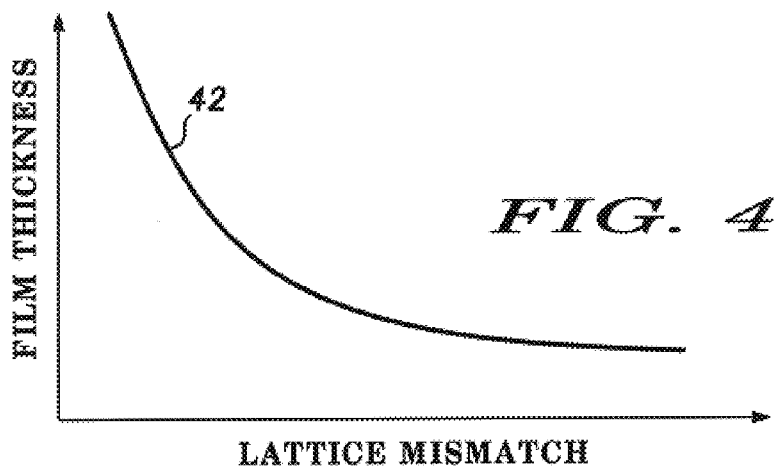
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that tend to be polycrystalline. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material 24 by 45° with respect to the crystal orientation of the silicon substrate wafer 22. The inclusion in the structure of amorphous interface layer 28, a silicon oxide layer in this example, if it is of sufficient thickness, serves to reduce strain in the titanate monocrystalline layer 24 that might result from any mismatch in the lattice constants of the host silicon wafer 22 and the grown titanate layer 24. As a result, a high quality, thick, monocrystalline titanate layer 24 is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, accommodating buffer layer 24 must be of high crystalline quality. In addition, in order to achieve high crystalline quality in layer 26, substantial matching between the crystal lattice constant of the host crystal, in this case, monocrystalline accommodating buffer layer 24, and grown crystal 26 is desired. With properly selected materials this substantial matching of lattice constants is achieved as a result of rotation of the crystal orientation of grown crystal 26 with respect to the orientation of host crystal 24. If grown crystal 26 is gallium arsenide, aluminum gallium arsenide, zinc selenide, or zinc sulfur selenide and accommodating buffer layer 24 is monocrystalline $Sr_xBa_{1-x}TiO_3$, substantial matching of crystal lattice constants of the two materials is achieved, wherein the crystal orientation of grown layer 26 is rotated by 45° with respect to the orientation of the host monocrystalline oxide 24. Similarly, if host material 24 is a strontium or barium zirconate or a strontium or barium hafnate or barium tin oxide and compound semiconductor layer 26 is indium phosphide or gallium indium arsenide or aluminum indium arsenide, substantial matching of crystal lattice constants can be achieved by rotating the orientation of grown crystal layer 26 by 45° with respect to host oxide crystal 24. In some instances, a crystalline semiconductor buffer layer 32 between host oxide 24 and grown compound semiconductor layer 26 can be used to reduce strain in grown monocrystalline compound semiconductor layer 26 that might result from small differences in lattice constants. Better crystalline quality in grown monocrystalline compound semiconductor layer 26 can thereby be achieved.

The following example illustrates a process, in accordance with one embodiment, for fabricating a semiconductor structure such as the structures depicted in FIGS. 1–3. The process starts by providing a monocrystalline semiconductor substrate 22 comprising silicon or germanium. In accordance with a preferred embodiment, semiconductor substrate 22 is a silicon wafer having a (100) orientation. Substrate 22 is preferably oriented on axis or, at most, about 0.5° off axis. At least a portion of semiconductor substrate 22 has a bare surface, although other portions of the substrate, as described below, may encompass other structures. The term "bare" in this context means that the surface in the portion of substrate 22 has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process. In order to epitaxially grow a monocrystalline oxide layer 24 overlying monocrystalline substrate 22, the native oxide layer must first be removed to expose the crystalline structure of underlying substrate 22. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkali earth metals or combinations of alkali earth metals in an MBE apparatus. In the case where strontium is used, the substrate 22 is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer 24 of a monocrystalline oxide. The template provides the necessary chemical and physical properties to nucleate the crystalline growth of an overlying layer 24.

In accordance with an alternate embodiment, the native silicon oxide can be converted and the surface of substrate 22 can be prepared for the growth of a monocrystalline oxide layer 24 by depositing an alkali earth metal oxide, such as strontium oxide or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate 22 surface. Again, this forms a template for the subsequent growth of an ordered monocrystalline oxide layer 24.

Following the removal of the silicon oxide from the surface of substrate 22, the substrate is cooled to a temperature in the range of about 200–800° C. and a layer 24 of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer 28 at the interface between underlying substrate 22 and the growing strontium titanate layer 24. The growth of silicon oxide layer 28 results from the diffusion of oxygen through the growing strontium titanate layer 24 to the interface where the oxygen reacts with silicon at the surface of underlying substrate 22. The strontium titanate grows as an ordered monocrystal 24 with the crystalline orientation rotated by 45° with respect to the ordered 2×1 crystalline structure of underlying substrate 22. Strain that otherwise might exist in strontium titanate layer 24 because of the small mismatch in lattice constant between silicon substrate 22 and the growing crystal 24 is relieved in amorphous silicon oxide intermediate layer 28.

After strontium titanate layer 24 has been grown to the desired thickness, the monocrystalline strontium titanate is capped by a template layer 30 that is conducive to the subsequent growth of an epitaxial layer of a desired compound semiconductor material 26. For the subsequent growth of a layer 26 of gallium arsenide, the MBE growth of strontium titanate monocrystalline layer 24 can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template 30 for deposition and formation of a gallium arsenide monocrystalline layer 26. Following the formation of template 30, gallium is subsequently introduced to the reaction with the arsenic and gallium arsenide 26 forms. Alternatively, gallium can be deposited on the capping layer to form a Sr—O—Ga bond, and arsenic is subsequently introduced with the gallium to form the GaAs.

Figure 5:
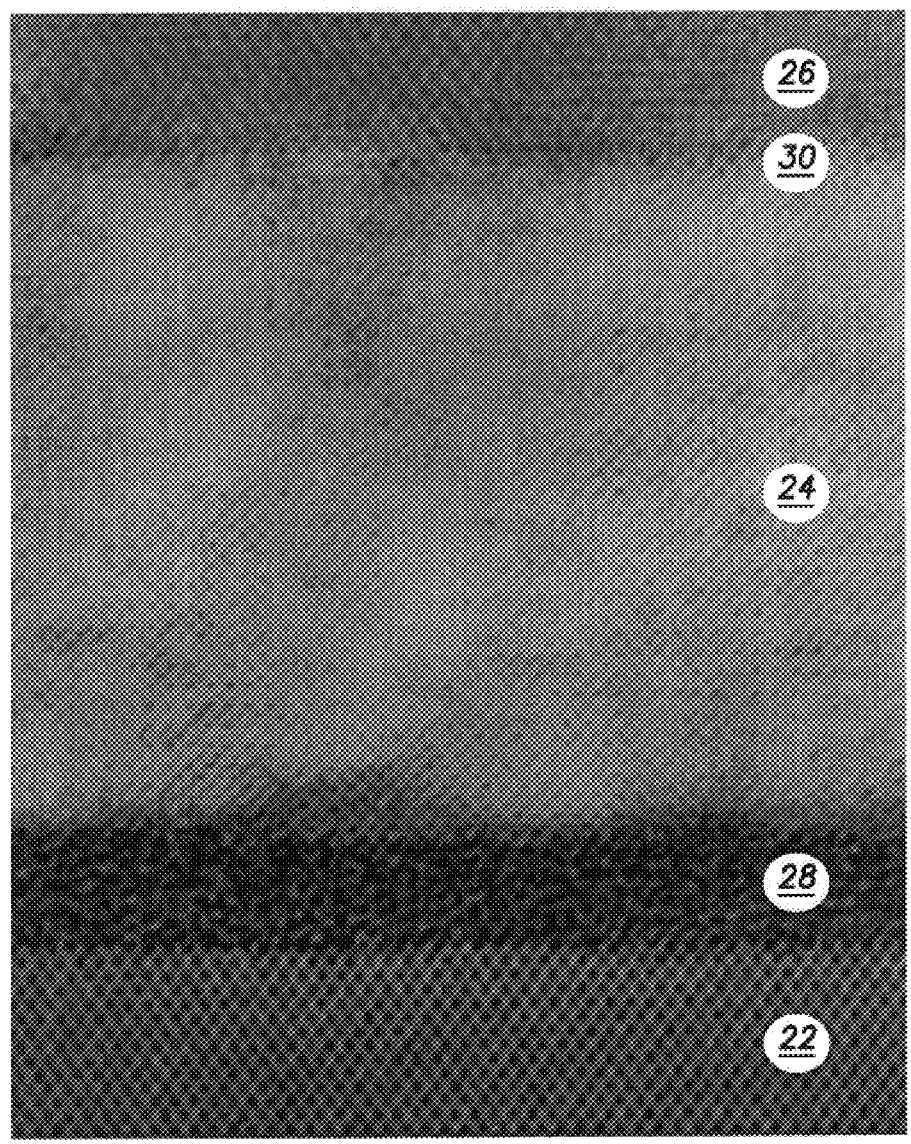
FIG. 5 is a high resolution Transmission Electron Micrograph (TEM) of illustrative semiconductor material manufactured in accordance with what is shown herein.

FIG. 5 is a high resolution Transmission Electron Micrograph (TEM) of semiconductor material manufactured in accordance with the present invention. Single crystal SrTiO3 accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
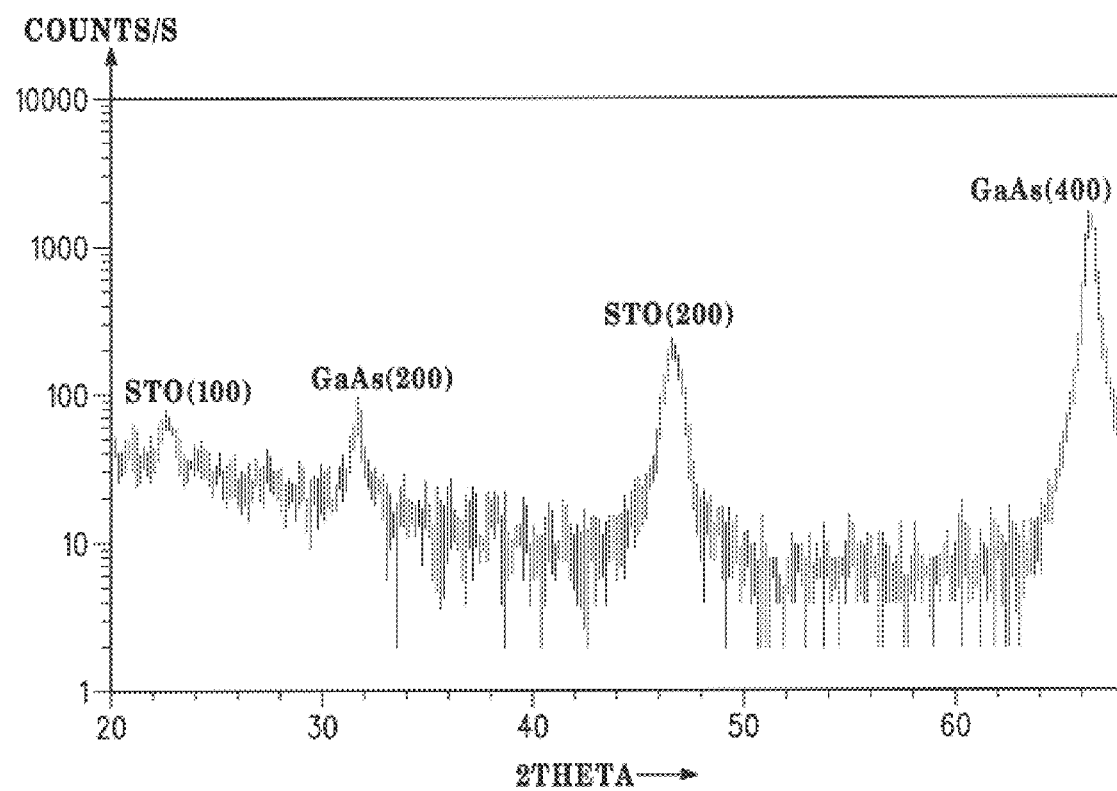
FIG. 6 is an x-ray diffraction taken on an illustrative semiconductor structure manufactured in accordance with what is shown herein.

FIG. 6 illustrates an x-ray diffraction spectrum taken on structure including GaAs compound semiconductor layer 26 grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer 32 deposition step. Buffer layer 32 is formed overlying template layer 30 before the deposition of monocrystalline compound semiconductor layer 26. If buffer layer 32 is a compound semiconductor superlattice, such a superlattice can be deposited, by MBE for example, on the template 30 described above. If instead buffer layer 32 is a layer of germanium, the process above is modified to cap strontium titanate monocrystalline layer 24 with a final layer of either strontium or titanium and then by depositing germanium to react with the strontium or titanium. The germanium buffer layer 32 can then be deposited directly on this template 30.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and semiconductor layer 38 to a rapid thermal anneal process with a peak temperature of about 700° C. to about 1000° C. and a process time of about 1 to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
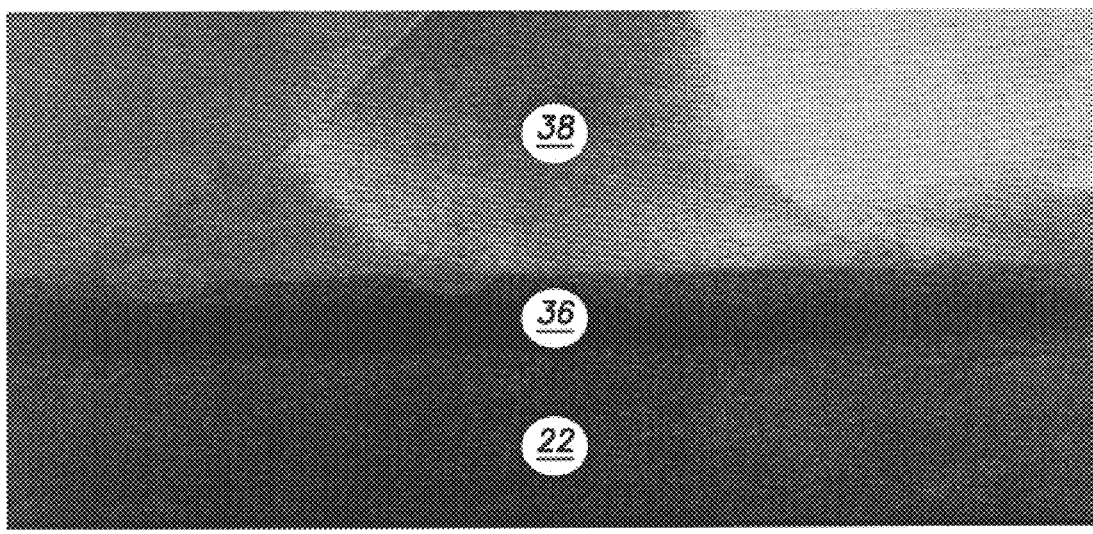
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In Accordance with this embodiment, a single crystal SrTiO3 accommodating buffer layer was grown epitaxially on silicon substrate 22. During this growth process, an amorphous interfacial layer forms as described above. Next, GaAs layer 38 is formed above the accommodating buffer layer and the accommodating buffer layer is exposed to an anneal process to form amorphous oxide layer 36.

Figure 8:
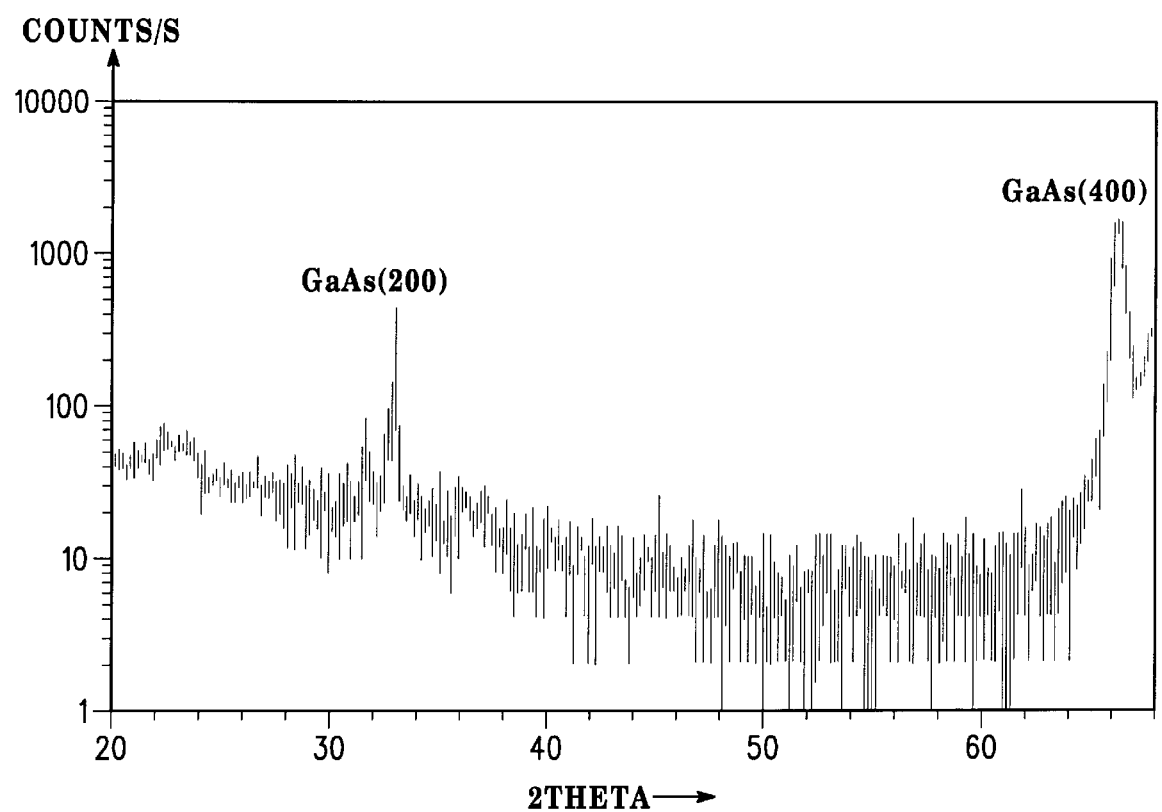
FIG. 8 illustrates an x-ray diffraction spectrum of a structure including an amorphous oxide layer.

FIG. 8 illustrates an x-ray diffraction spectrum taken on a structure including GaAs compound semiconductor layer 38 and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate 22, an overlying oxide layer, and a monocrystalline gallium arsenide compound semiconductor layer 26 by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers 24 such as alkaline earth metal titanates, zirconates, hafnates, tantalates, vanadates, ruthenates, and niobates, perovskite oxides such as alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers 26 can be deposited overlying monocrystalline oxide accommodating buffer layer 24.

Each of the variations of compound semiconductor materials 26 and monocrystalline oxide accommodating buffer layer 24 uses an appropriate template 30 for initiating the growth of the compound semiconductor layer. For example, if accommodating buffer layer 24 is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if monocrystalline oxide accommodating buffer layer 24 is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer 26, respectively. In a similar manner, strontium titanate 24 can be capped with a layer of strontium or strontium and oxygen, and barium titanate 24 can be capped with a layer of barium or barium and oxygen. Each of these depositions can be followed by the deposition of arsenic or phosphorus to react with the capping material to form a template 30 for the deposition of a compound semiconductor material layer 26 comprising indium gallium arsenide, indium aluminum arsenide, or indium phosphide.

Figure 9:
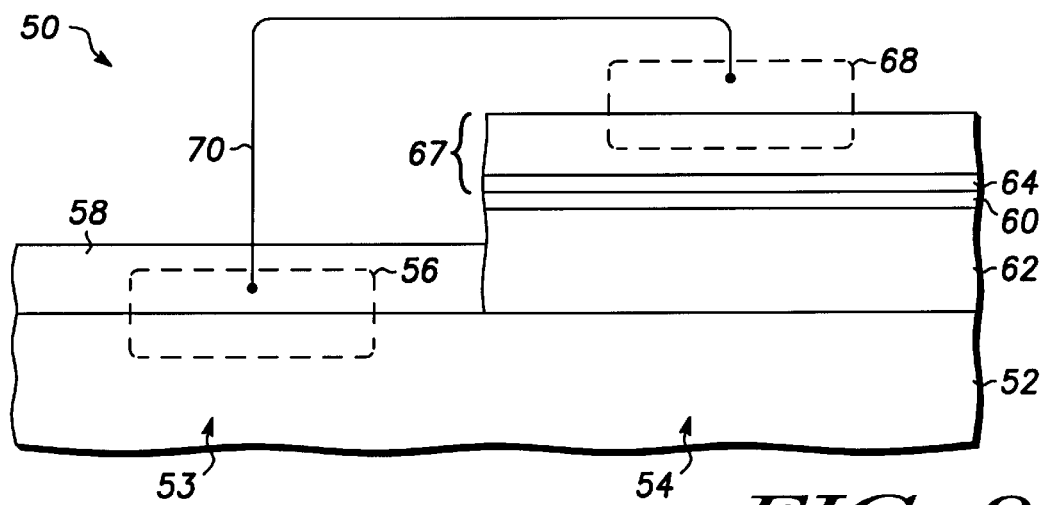

FIG. 9 illustrates schematically, in cross section, a device structure 50 in accordance with a further embodiment. Device structure 50 includes a monocrystalline semiconductor substrate 52, preferably a monocrystalline silicon wafer. Monocrystalline semiconductor substrate 52 includes two regions, 53 and 54. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 58 such as a layer of silicon dioxide or the like may overlie electrical semiconductor component 56.

Insulating material 58 and any other layers that may have been formed or deposited during the processing of semiconductor component 56 in region 53 are removed from the surface of region 54 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 54 and is reacted with the oxidized surface to form a first template layer (not shown). In accordance with one embodiment, a monocrystalline oxide layer is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 54 to form an amorphous layer of silicon oxide on second region 54 and at the interface between silicon substrate 52 and the monocrystalline oxide. Layers 60 and 62 may be subject to an annealing process as described above in connection with FIG. 3 to form a single amorphous accommodating layer.

In accordance with an embodiment, the step of depositing the monocrystalline oxide layer is terminated by depositing a second template layer 60, which can be 1–10 monolayers of titanium, barium, barium and oxygen, or titanium and oxygen. A layer 66 of a monocrystalline compound semiconductor material is then deposited overlying second template layer 64 by a process of molecular beam epitaxy. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 60 and a gallium arsenide layer 66, similar devices can be fabricated using other substrates, monocrystalline oxide layers and other compound semiconductor layers as described elsewhere in this disclosure.

Figure 10:
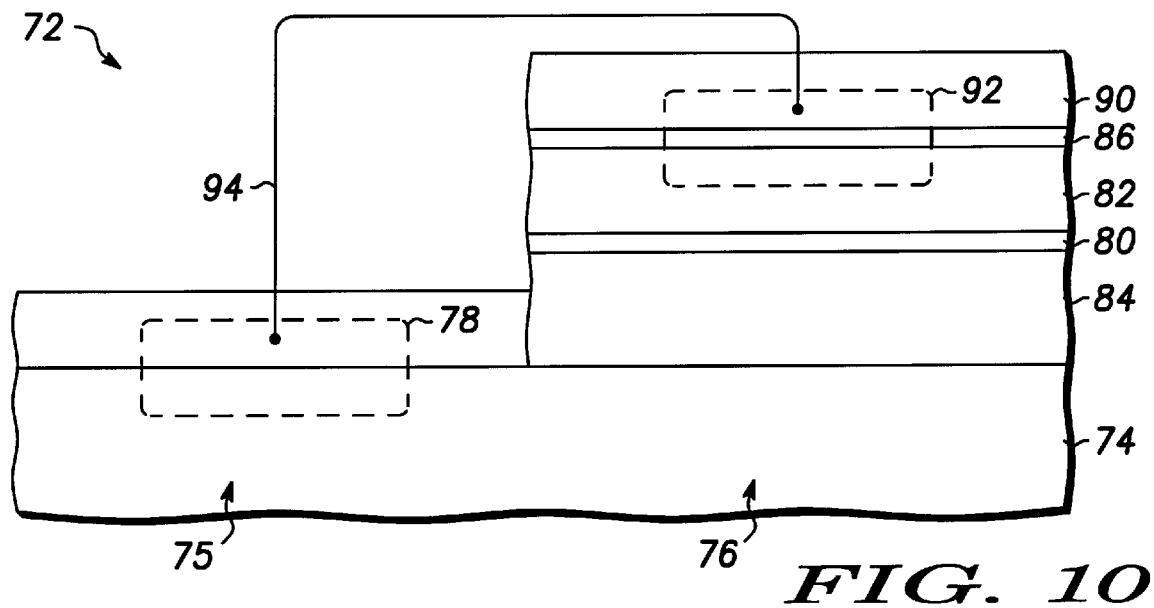

FIG. 10 illustrates a semiconductor structure 72 in accordance with a further embodiment. Structure 72 includes a monocrystalline semiconductor substrate 74 such as a monocrystalline silicon wafer that includes a region 75 and a region 76. An electrical component schematically illustrated by the dashed line 78 is formed in region 75 using conventional silicon device processing techniques commonly used in the semiconductor industry. Using process steps similar to those described above, a monocrystalline oxide layer 80 and an intermediate amorphous silicon oxide layer 82 are formed overlying region 76 of substrate 74. A template layer 84 and subsequently a monocrystalline semiconductor layer 86 are formed overlying monocrystalline oxide layer 80. In accordance with a further embodiment, an additional monocrystalline oxide layer 88 is formed overlying layer 86 by process steps similar to those used to form layer 80, and an additional monocrystalline semiconductor layer 90 is formed overlying monocrystalline oxide layer 88 by process steps similar to those used to form layer 86. In accordance with one embodiment, at least one of layers 86 and 90 are formed from a compound semiconductor material. Layers 80 and 82 may be subject to an annealing process as described above in connection with FIG. 3 to form a single amorphous accommodating layer.

A semiconductor component generally indicated by a dashed line 92 is formed at least partially in monocrystalline semiconductor layer 86. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 86 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 78 and component 92. Structure 72 thus integrates components that take advantage of the unique properties of the two monocrystalline semiconductor materials.

Figure 11:
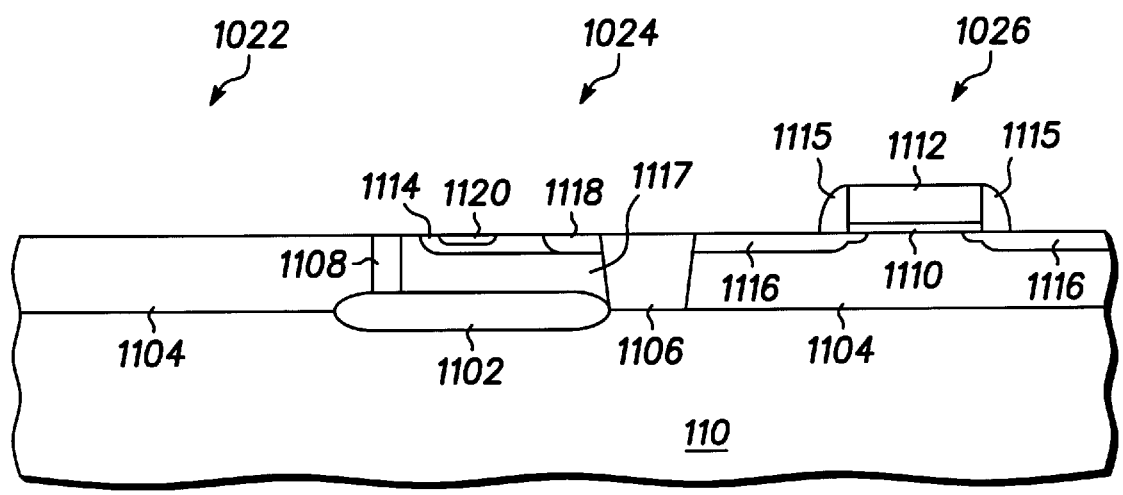
FIGS. 11–15 include illustrations of cross-sectional views of a portion of an integrated circuit that includes a compound semiconductor portion, a bipolar portion, and an MOS portion in accordance with what is shown herein.

Attention is now directed to a method for forming exemplary portions of illustrative composite semiconductor structures or composite integrated circuits like 50 or 72. In particular, the illustrative composite semiconductor structure or integrated circuit 102 shown in FIGS. 6–10 includes a compound semiconductor portion 1022, a bipolar portion 1024, and an MOS portion 1026. In FIG. 11, a p-type doped, monocrystalline silicon substrate 110 is provided having a compound semiconductor portion 1022, a bipolar portion 1024, and an MOS portion 1026. Within bipolar portion 1024, the monocrystalline silicon substrate 110 is doped to form an N⁺ buried region 1102. A lightly p-type doped epitaxial monocrystalline silicon layer 1104 is then formed over the buried region 1102 and the substrate 110. A doping step is then performed to create a lightly n-type doped drift region 1117 above the N⁺ buried region 1102. The doping step converts the dopant type of the lightly p-type epitaxial layer within a section of the bipolar region 1024 to a lightly n-type monocrystalline silicon region. A field isolation region 1106 is then formed between the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N⁺ doped regions 1116 and the emitter region 1120. N⁺ doped regions 1116 are formed within layer 1104 along adjacent sides of the gate electrode 1112 and are source, drain, or source/drain regions for the MOS transistor. The N⁺ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P⁺ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. As of this point, no circuitry has been formed within the compound semiconductor portion 1022.

All of the layers that have been formed during the processing of the bipolar and MOS portions of the integrated circuit are now removed from the surface of compound semiconductor portion 1022. A bare silicon surface is thus provided for the subsequent processing of this portion, for example in the manner set forth above.

Figure 12:
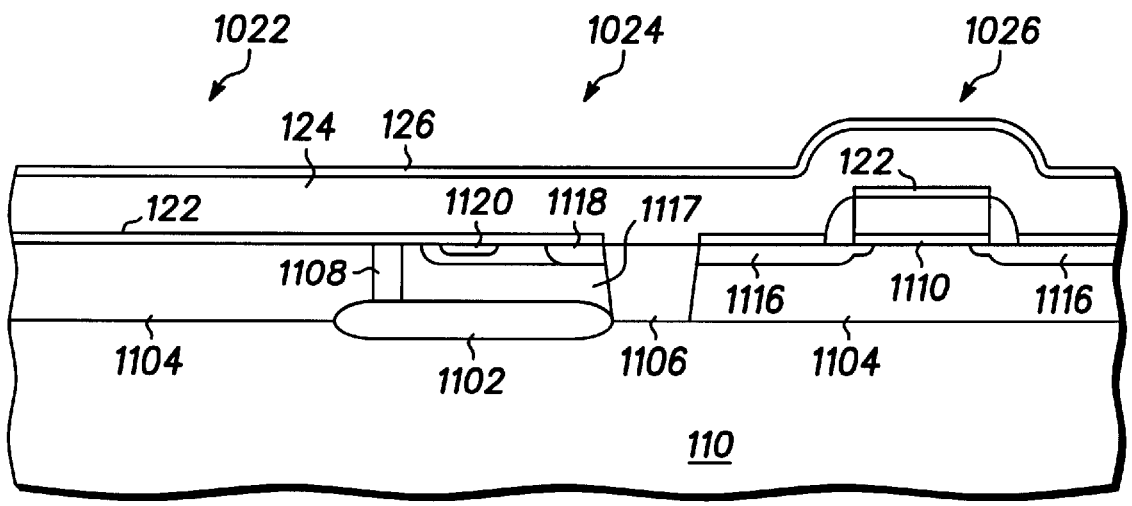

An accommodating buffer layer 124 is then formed over the substrate 110 as illustrated in FIG. 12. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 102. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 126 is then formed and has a thickness in a range of approximately one to ten monolayers of a material. In one particular embodiment, the material includes titanium-arsenic, strontium-oxygen-arsenic, or other similar materials as previously described with respect to FIGS. 1–5. Layers 122 and 124 may be subject to an annealing process as described above in connection with FIG. 3 to form a single amorphous accommodating layer.

Figure 13:
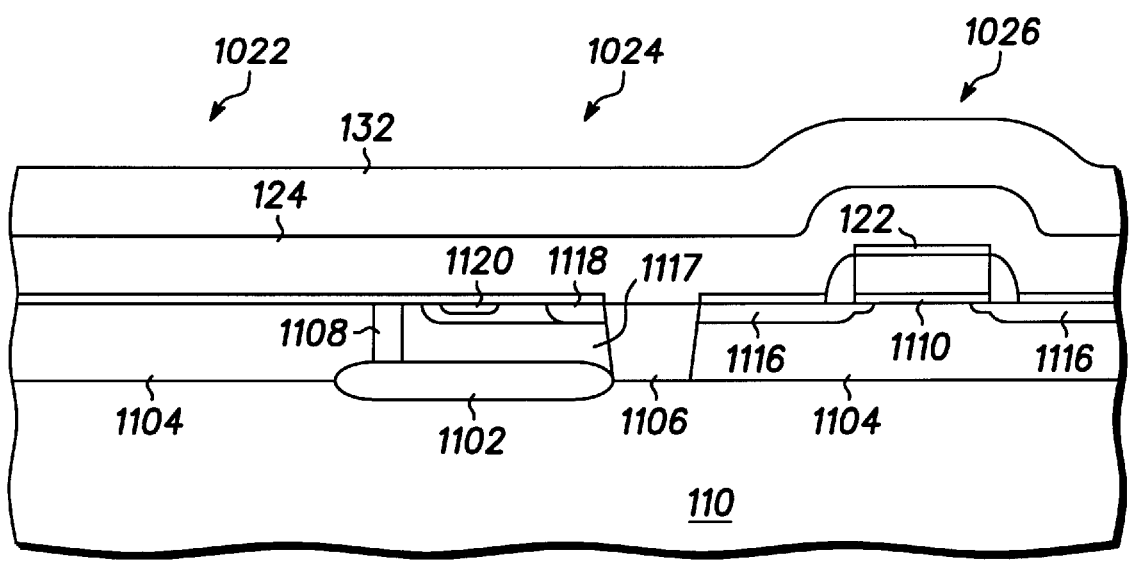

A monocrystalline compound semiconductor layer 132 is then epitaxially grown overlying the monocrystalline portion of accommodating buffer layer 124 (or over the amorphous accommodating layer if the annealing process described above has been carried out) as shown in FIG. 13. The portion of layer 132 that is grown over portions of layer 124 that are not monocrystalline may be polycrystalline or amorphous. The monocrystalline compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–500 nm. In this particular embodiment, each of the elements within the template layer are also present in the accommodating buffer layer 124, the monocrystalline compound semiconductor material 132, or both. Therefore, the delineation between the template layer 126 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

Figure 14:
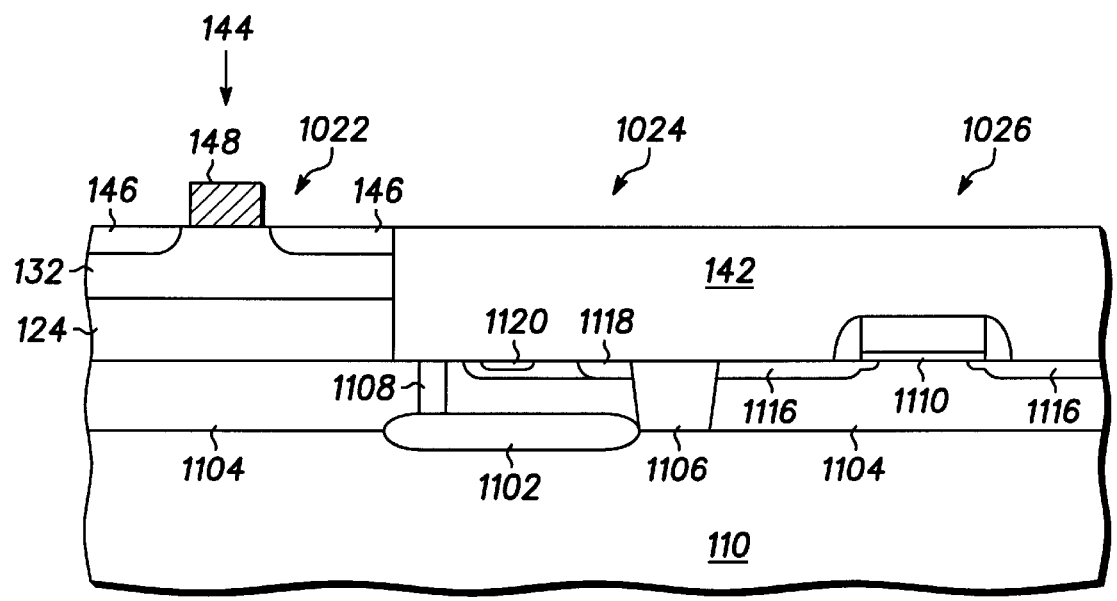

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 14. After the section is removed, an insulating layer 142 is then formed over the substrate 110. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished, removing portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and monocrystalline compound semiconductor layer 132 are also n-type doped. If a p-type MESFET were to be formed, then the doped regions 146 and monocrystalline compound semiconductor layer 132 would have just the opposite doping type. The heavier doped ($N^+$) regions 146 allow ohmic contacts to be made to the monocrystalline compound semiconductor layer 132. At this point in time, the active devices within the integrated circuit have been formed. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETS, and combinations of vertical and planar transistors, can be used. Also, other electrical components, such as resistors, capacitors, diodes, and the like, may be formed in one or more of the portions 1022, 1024, and 1026.

Figure 15:
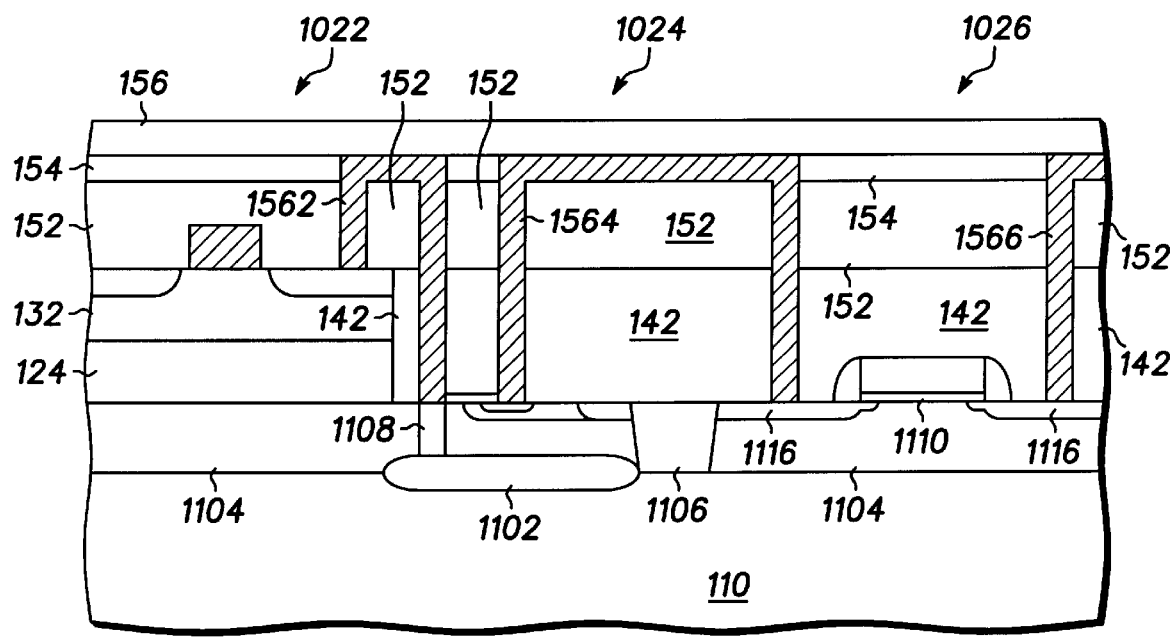

Processing continues to form a substantially completed integrated circuit 102 as illustrated in FIG. 15. An insulating layer 152 is formed over the substrate 110. The insulating layer 152 may include an etch-stop or polish-stop region that is not illustrated in FIG. 15. A second insulating layer 154 is then formed over the first insulating layer 152. Portions of layers 154, 152, 142, 124, and 122 are removed to define contact openings where the devices are to be interconnected. Interconnect trenches are formed within insulating layer 154 to provide the lateral connections between the contacts. As illustrated in FIG. 15, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown.

A passivation layer 156 is formed over the interconnects 1562, 1564, and 1566 and insulating layer 154. Other electrical connections are made to the transistors as illustrated as well as to other electrical or electronic components within the integrated circuit 102 but are not illustrated in the FIGS. Further, additional insulating layers and interconnects may be formed as necessary to form the proper interconnections between the various components within the integrated circuit 102.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion into the compound semiconductor portion 1022 or the MOS portion 1024. Therefore, the requirement of special fabricating steps solely used for making a bipolar transistor can be eliminated. Therefore, there would only be a compound semiconductor portion and an MOS portion to the integrated circuit.

In still another embodiment, an integrated circuit can be formed such that it includes an optical laser in a compound semiconductor portion and an optical interconnect (waveguide) to an MOS transistor within a Group IV semiconductor region of the same integrated circuit. FIGS. 16–22 include illustrations of one embodiment.

Figure 16:
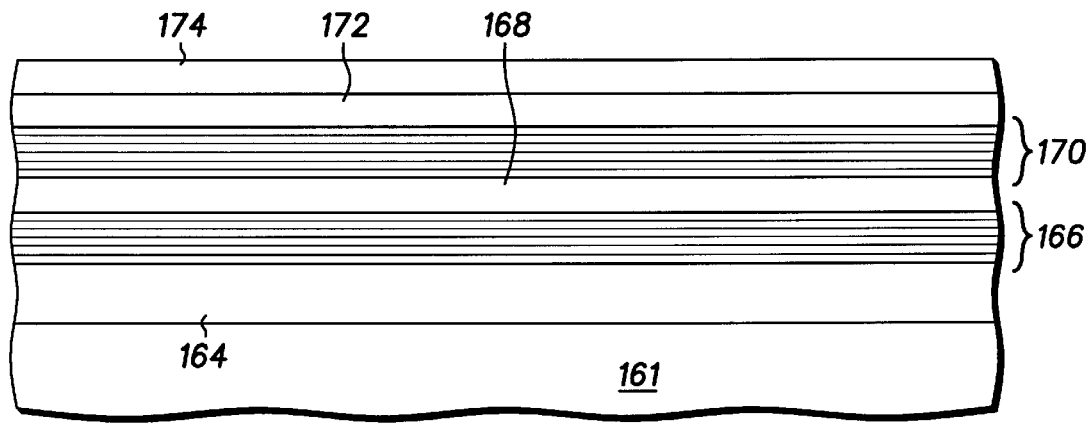
FIGS. 16–22 include illustrations of cross-sectional views of a portion of another integrated circuit that includes a semiconductor laser and an MOS transistor in accordance with what is shown herein.

FIG. 16 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. In this specific embodiment, the layers needed to form the optical laser will be formed first, followed by the layers needed for the MOS transistor. In FIG. 16, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. Layer 172 may be subject to an annealing process as described above in connection with FIG. 3 to form an amorphous accommodating layer. A monocrystalline Group IV semiconductor layer 174 is formed over the accommodating buffer layer 172. In one particular embodiment, the monocrystalline Group IV semiconductor layer 174 includes germanium, silicon germanium, silicon germanium carbide, or the like.

Figure 17:
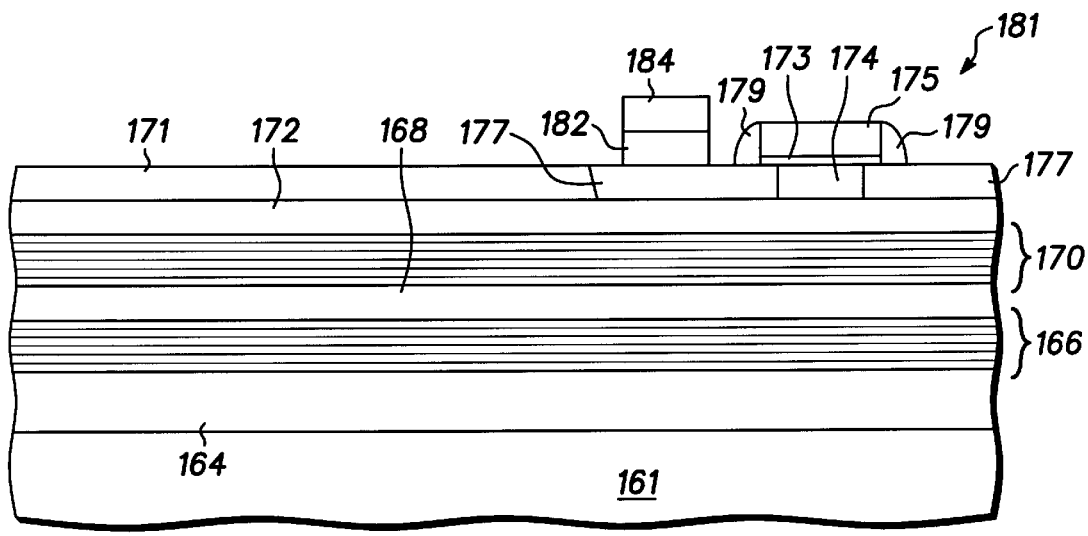

In FIG. 17, the MOS portion is processed to form electrical components within this upper monocrystalline Group IV semiconductor layer 174. As illustrated in FIG. 17, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 17. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 17.

Figure 18:
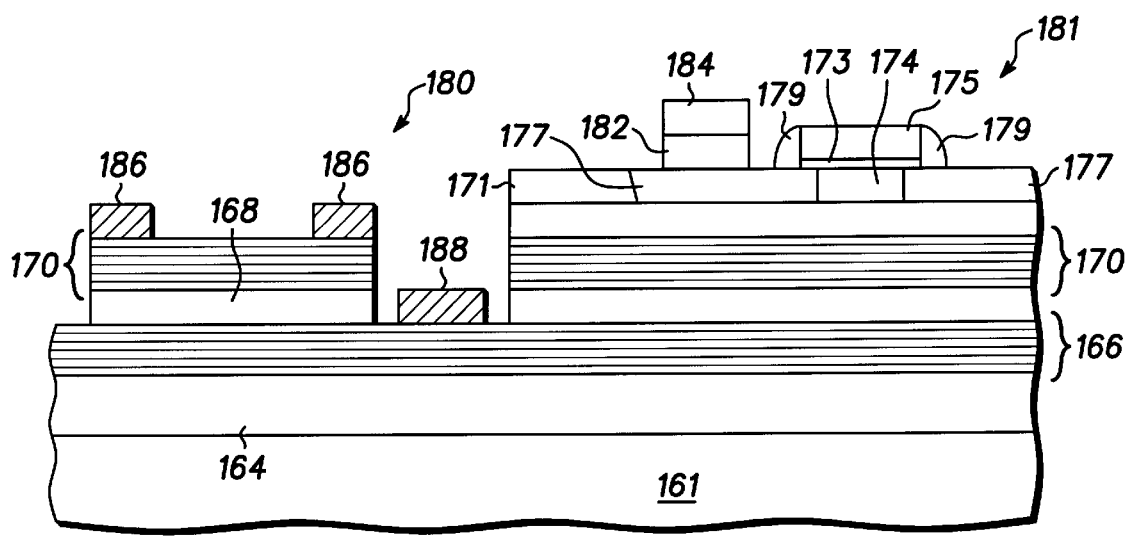

The next set of steps is performed to define the optical laser 180 as illustrated in FIG. 18. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 18. Contact 186 has an annular shape to allow light (photons) to pass out of the upper mirror layer 170 into a subsequently formed optical waveguide.

Figure 19:
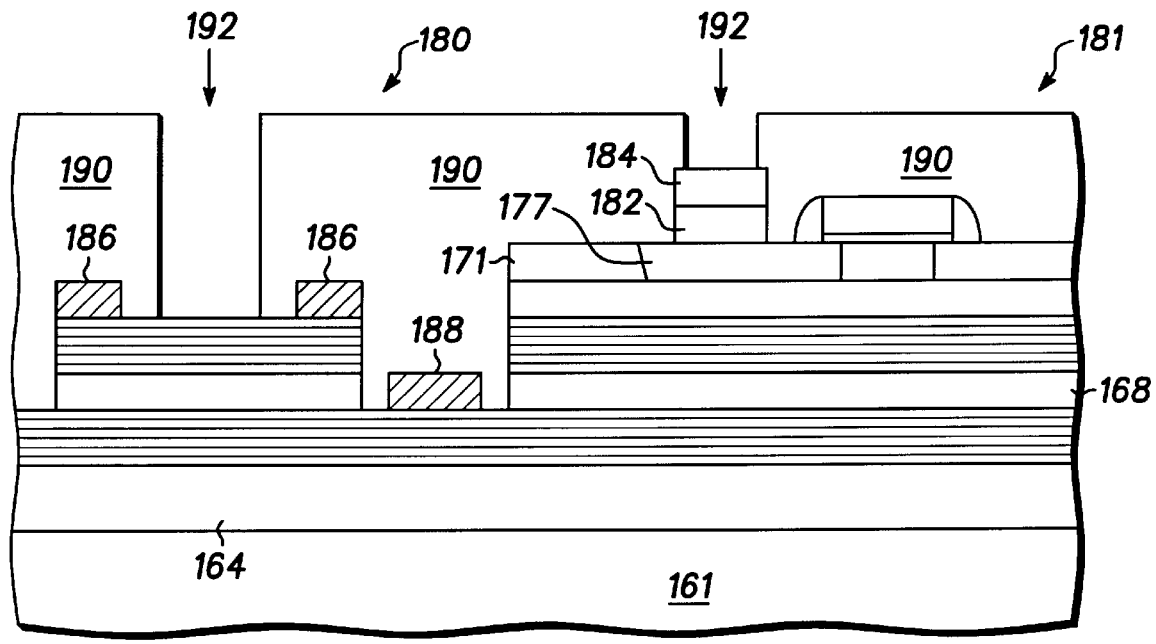
Figure 20:
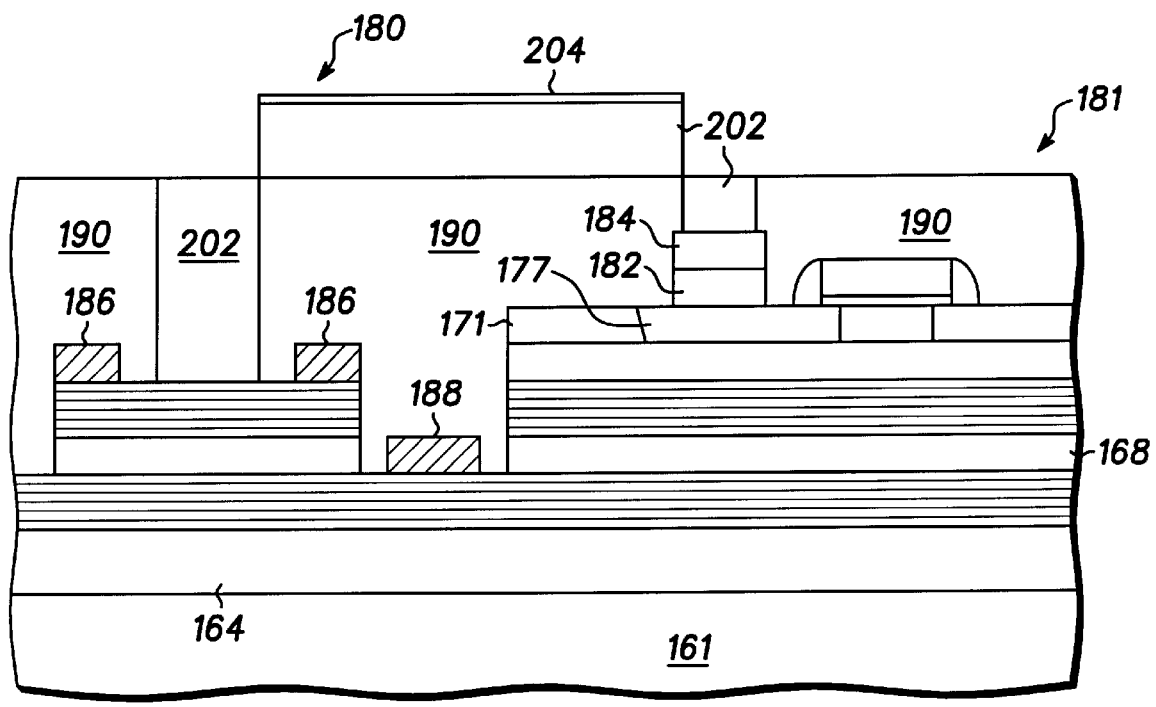

An insulating layer 190 is then formed and patterned to define optical openings extending to the contact layer 186 and one of the doped regions 177 as shown in FIG. 19. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 20. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 15.

Figure 21:
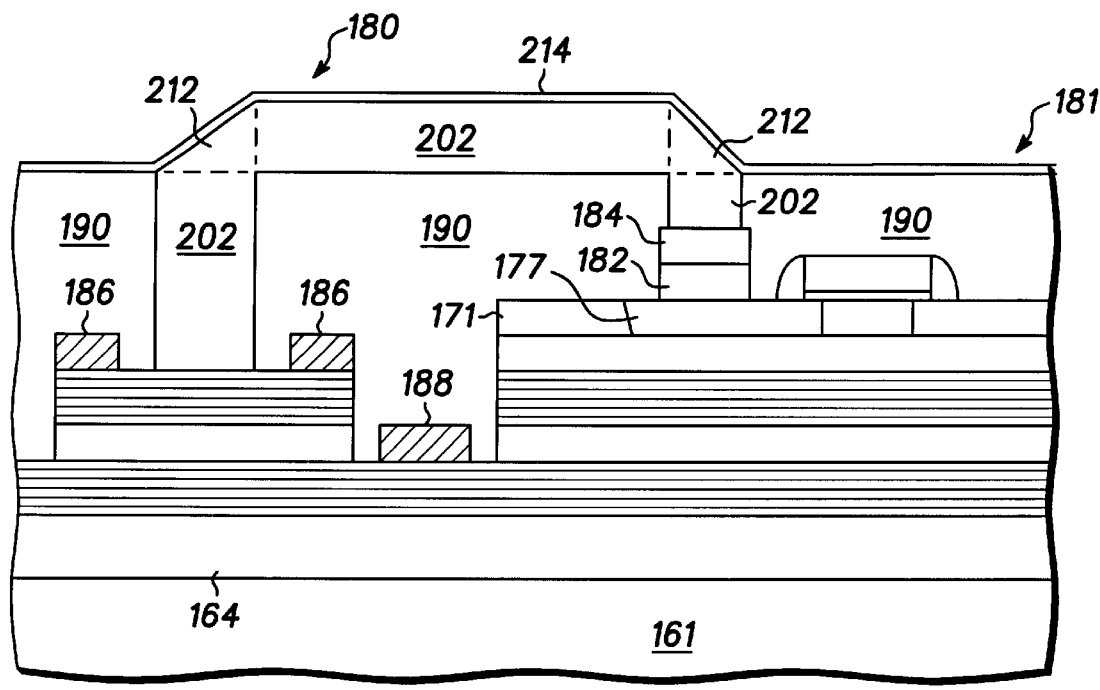

The balance of the formation of the optical waveguide, which is an optical interconnect, is completed as illustrated in FIG. 21. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 21 illustrate the border between the high refractive index materials 202 and 212. This designation is used to identify that both are made of the same material but are formed at different times.

Figure 22:
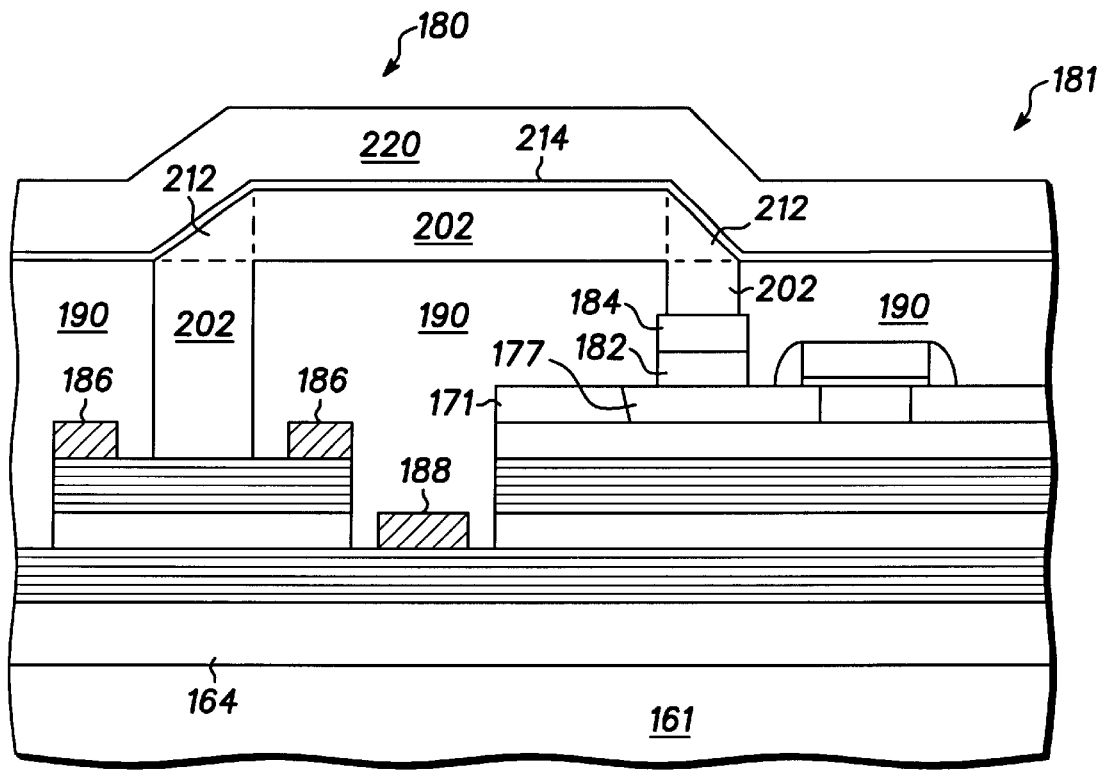

Processing is continued to form a substantially completed integrated circuit as illustrated in FIG. 22. A passivation layer 220 is then formed over the optical laser 180 and MOSFET transistor 181. Although not shown, other electrical or optical connections are made to the components within the integrated circuit but are not illustrated in FIG. 22. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate what can be done and are not intended to be exhaustive of all possibilities or to limit what can be done. There is a multiplicity of other possible combinations and embodiments. For example, the compound semiconductor portion may include light emitting diodes, photodetectors, diodes, or the like, and the Group IV semiconductor can include digital logic, memory arrays, and most structures that can be formed in conventional MOS integrated circuits. By using what is shown and described herein, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor devices should decrease because larger substrates can be processed more economically and more readily, compared to the relatively smaller and more fragile, conventional compound semiconductor wafers.

The foregoing techniques may be used to create hybrid integrated circuits that support optical communications. The hybrid integrated circuits may be referred to as "hybrid" circuits because they may have monocrystalline substrates (e.g., silicon substrates) that support complex electronic circuits and optically-active compound semiconductor components (e.g., GaAs or InP lasers or the like).

Figure 23:
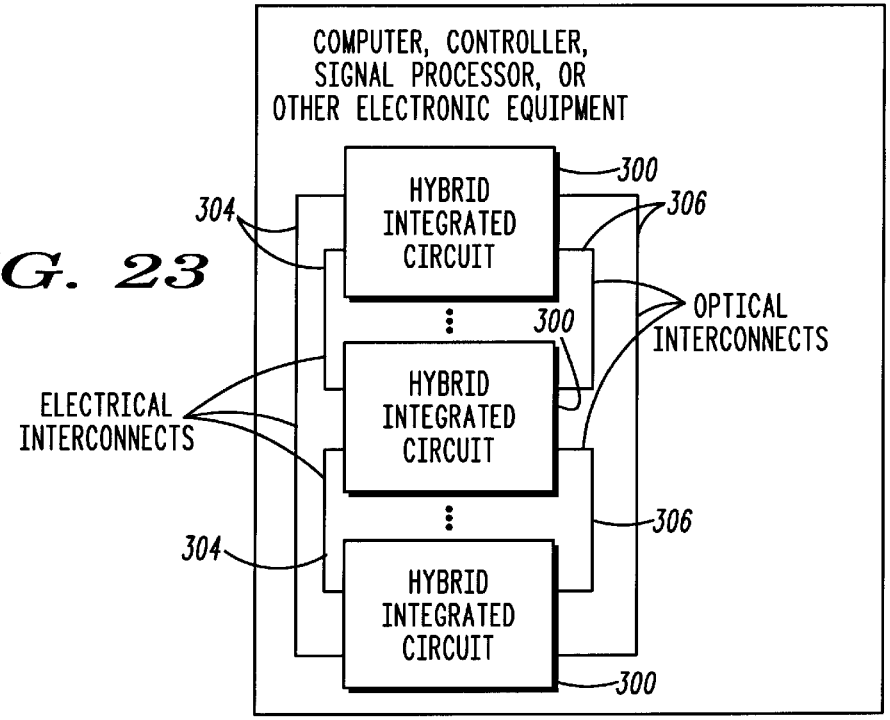
FIG. 23 is a schematic diagram of illustrative electronic equipment based on hybrid integrated circuits and optical interconnects in accordance with the present invention.

As shown in FIG. 23, electrical components based on hybrid integrated circuits 300 may be part of a computer, controller, signal processor, or other electronic equipment 302. Hybrid integrated circuits 300 may be interconnected using electrical interconnects 304 and optical interconnects 306. Suitable electrical interconnects may include printed circuit board interconnects, electrical backplane interconnects, wires, cables, or other electrical packaging and interconnection structures.

Figure 24A:
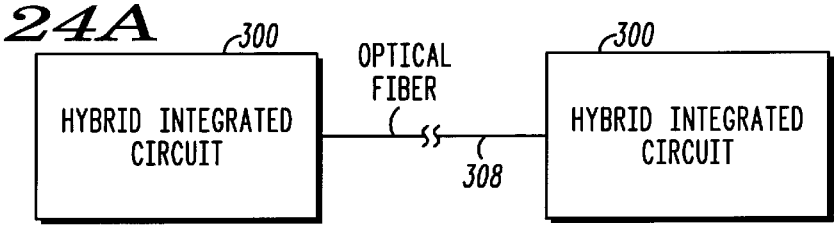
FIG. 24a is a schematic diagram of an illustrative configuration in which hybrid integrated circuits may communicate over optical fiber in accordance with the present invention.
Figure 24B:
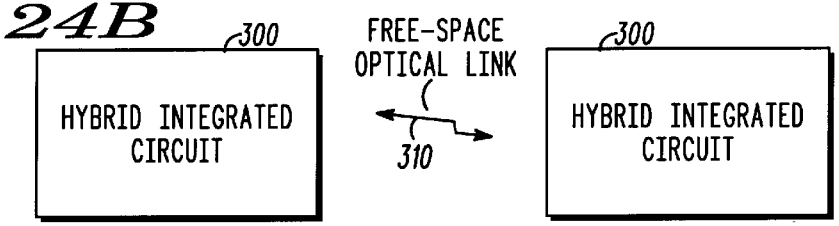
FIG. 24b is a schematic diagram of an illustrative configuration in which hybrid integrated circuits may communicate over a free-space link in accordance with the present invention.
Figure 24C:
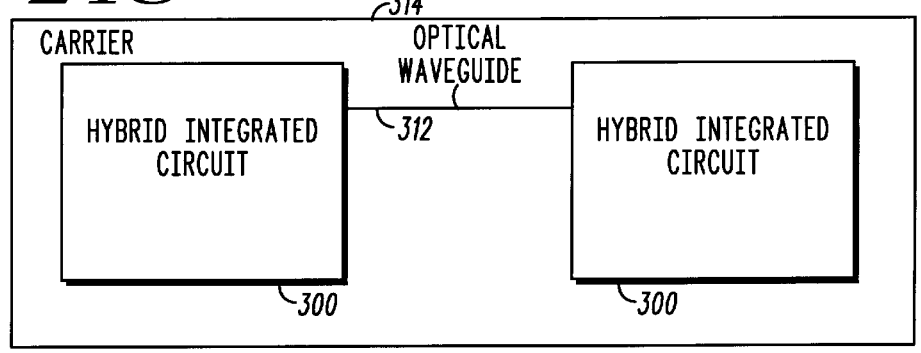
FIG. 24c is a schematic diagram of an illustrative configuration in which hybrid integrated circuits may communicate over an optical waveguide link in accordance with the present invention.

As shown in FIG. 24a, optical interconnects 306 may include fiber optic paths such as optical fiber path 308. FIG. 24b shows how optical interconnects 306 may be based on free-space optical links such as free-space optical link 310. If desired, hybrid integrated circuits 300 may be linked using optical waveguides such as optical waveguides 312 as shown in FIG. 24c. Optical waveguides 312 may, for example, be polymer or glass waveguides that are integrated onto a printed circuit board or other suitable carrier 314. Optical ports on hybrid integrated circuits 300 are used to communicate over these various types of optical interconnects.

Figure 25A:
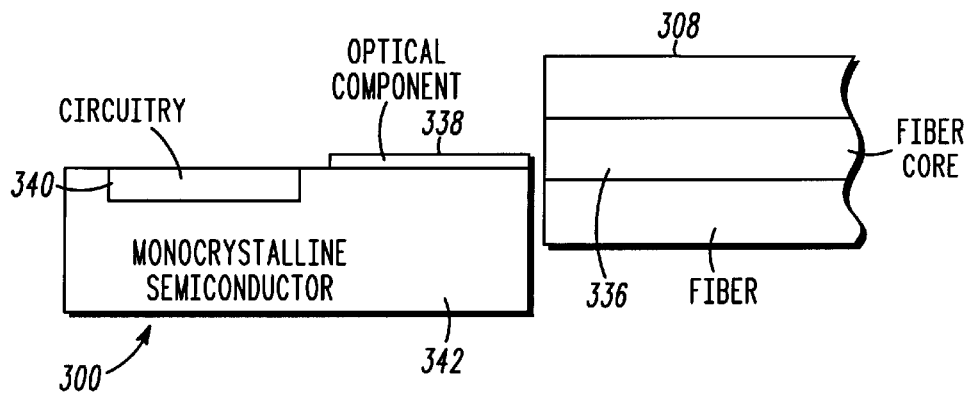
FIG. 25a is a diagram showing how an optical fiber may be horizontally coupled to a hybrid integrated circuit in accordance with the present invention.

Optical fiber 308 may be coupled to the circuitry on hybrid integrated circuit 300 using a horizontal configuration, as shown in FIG. 20a. In the arrangement of FIG. 25a, core 336 of fiber 308 is aligned with optical component 338. Optical component 338 may be any suitable optical component for receiving or transmitting signals and may include, for example, optical waveguides such as strip-loaded, buried, or ridge optical waveguides, optical sources such as semiconductor lasers and light-emitting diodes, optical modulators (e.g., electro-optical modulators), optical detectors, etc. Circuitry 340 may be used to electrically process signals on hybrid integrated circuit 300.

Figure 25B:
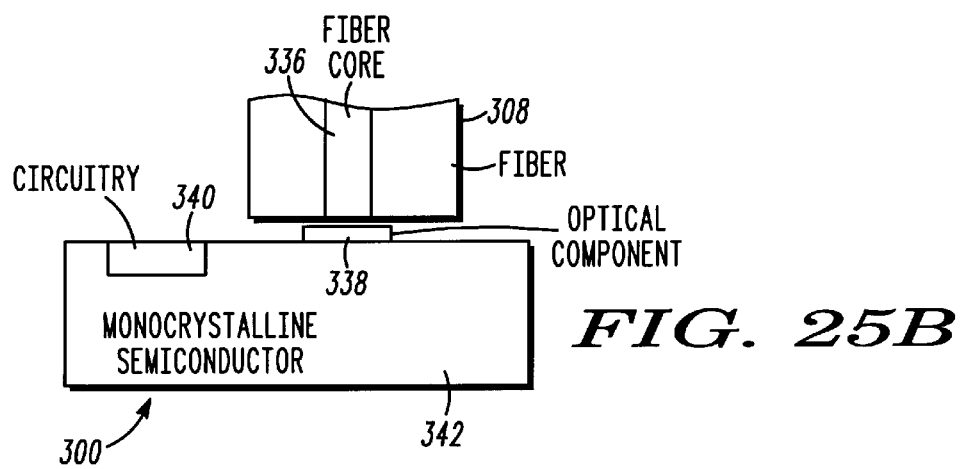
FIG. 25b is a diagram showing how an optical fiber may be vertically coupled to a hybrid integrated circuit in accordance with the present invention.

A vertical configuration is shown in FIG. 25b. In the arrangement of FIG. 25b, core 336 of vertically-oriented fiber 308 may be aligned with optical component 338. Optical component 338 may be any suitable optical component for receiving or transmitting signals and may include, for example, optical sources such as vertical-cavity semiconductor lasers of the type described above, light-emitting diodes, optical modulators, optical detectors, etc. Circuitry 340 may be used to electrically process signals on hybrid integrated circuit 300.

Additional packaging structures (e.g., support structures, adhesives, I/O pins, etc.) have not been shown in FIGS. 25a and 25b to avoid over-complicating the drawings, but such structures are preferably used to stabilize and support the connections of optical fiber 308 and the electrical wires for interconnects 304 (FIG. 23).

Figure 26:
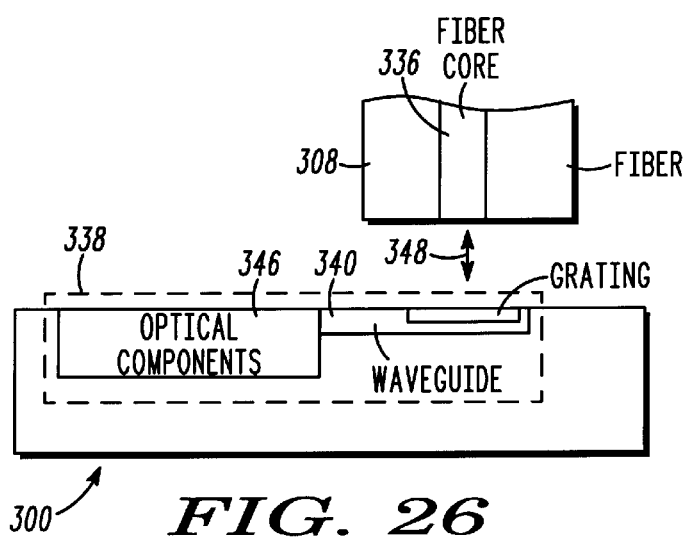
FIG. 26 is a diagram showing how a vertically-coupled optical fiber may communicate with optical components through a grating in accordance with the present invention.

If desired, a grating (e.g., a holographic grating or the like) may be used to couple optical signals between horizontal waveguide structures and vertical fibers. This is shown in FIG. 26. As shown in FIG. 26, optical fiber core 336 of fiber 308 may be aligned with grating 342 of optical component 338. Light 348 from core 336 that is incident on grating 342 may be coupled into waveguide 344 by the grating. Waveguide 344 may pass this light to optical components 346 (e.g., a detector). If optical components 346 generate light, the light may be transmitted to grating 342 by waveguide 344. When this light reaches grating 342, it is coupled vertically by the grating so that it may pass into core 336. If desired, other coupling structures such as micromirrors or the like may be used.

Figure 27:
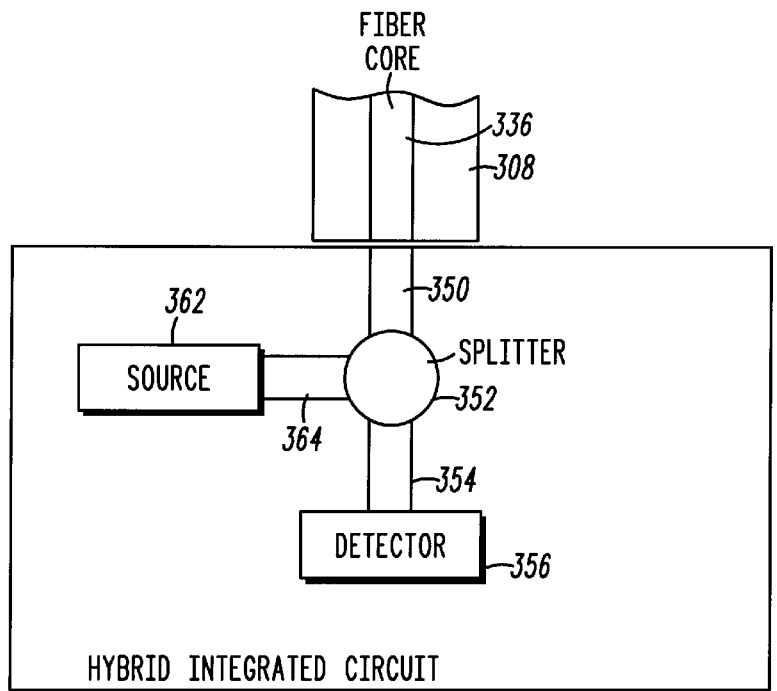
FIG. 27 is a diagram showing how a hybrid integrated circuit may have an optical splitter for handling both incoming and outgoing optical signals in accordance with the present invention.

A single optical fiber arrangement may be used to pass optical signals to hybrid integrated circuit 300 and to receive optical signals from hybrid integrated circuitry 300. An illustrative single-fiber arrangement that uses horizontal fiber coupling is shown in FIG. 27. In the example of FIG. 27, optical signals are provided to hybrid integrated circuit 300 from optical fiber 308. Light from optical fiber core 336 may be coupled into waveguide 350. A splitter 352 (e.g., a splitter based on a holographic grating or a waveguide or other suitable structure) may be used to direct at least a portion of the received light into waveguide 354. Waveguide 354 may be used to pass the received light into detector 356. Detector 356 and the other optical detectors described herein may be, for example, silicon photodetectors based on p-i-n structures or the like. Electrical signals from detector 356 may be passed to circuitry on hybrid integrated circuit 300 for electrical processing.

Signals to be transmitted may be passed to source 362 from circuitry on hybrid integrated circuit 300. Source 362 and the other sources described herein may be, for example, diode lasers based on the GaAs system or the InP system (sometimes simply referred to as GaAs or InP lasers). Light from source 362 may be passed to splitter 352 using waveguide 364. Splitter 352 may direct at least a portion of the light from waveguide 364 into waveguide 350. The transmitted light in waveguide 350 may be coupled to fiber core 336.

The waveguides used for hybrid integrated circuit 300 (e.g., the waveguides used in the example of FIG. 27) may be based on semiconductors (e.g., GaAs and AlGaAs) or may use other suitable materials such as polymers or glasses. For example, waveguides may be formed by sandwiching layers of GaAs (which have an index of refraction of approximately 3.5) between lower-index materials such as a lower layer and an optional upper layer of $Ga_xAl_{1-x}As$ (which, for example, may have an index of refraction of about 3.4 for $Ga_{0.7}Al_{0.3}As$). Such semiconductor waveguides may be mode matched to optical semiconductor components on the hybrid integrated circuit. For example, a GaAs/AlGaAs optical waveguide may be formed that has optical properties that are matched to a GaAs/AlGaAs laser diode structure on the hybrid integrated circuit. Waveguides formed out of glass or polymers or the like may be formed using an arrangement of the type shown in FIG. 22 or any other suitable arrangement.

Detectors and sources and modulators may be constructed using GaAs, InP, Si, or any other suitable semiconductors.

Non-semiconductor materials (e.g., electro-optic polymers or the like) may also be incorporated into hybrid integrated circuit 300 if desired.

Figure 28:
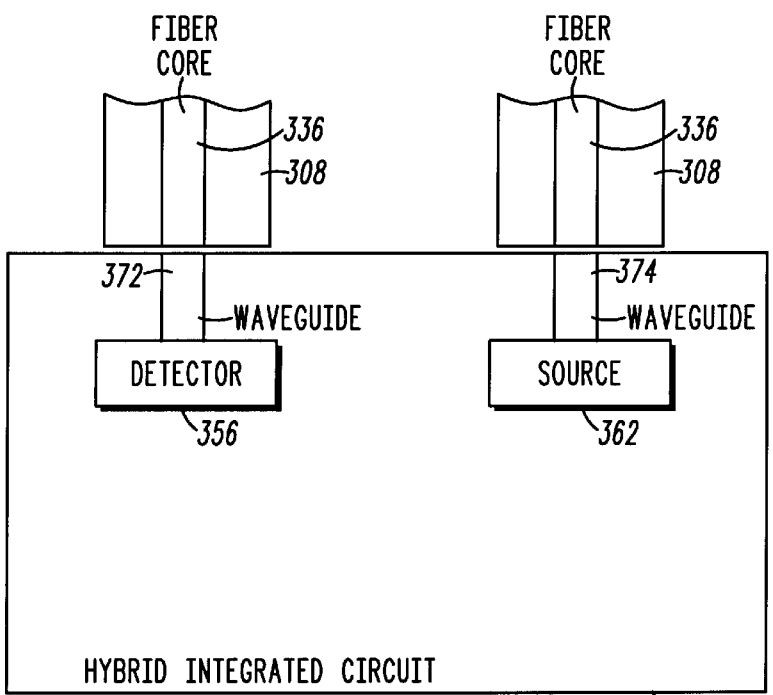
FIG. 28 is a diagram showing how separate optical fibers may be used to communicate with a source and detector on a hybrid integrated circuit in accordance with the present invention.

An illustrative arrangement in which dual fibers 308 are coupled to hybrid integrated circuit 300 is shown in FIG. 28. In the example of FIG. 28, the left-hand fiber 308 is used for optical input signals and the right-hand fiber 308 is used for optical output signals.

Any suitable number of optical fibers or other optical signal paths may be used for communications to and from the hybrid integrated circuit. For example, one or more optical fibers or other paths may be used to receive inputs (e.g., for receiving optical signals from different hybrid integrated circuits or other signal sources) and one or more fibers may be used for outputs (e.g., for sending optical signals to different hybrid integrated circuits or the like). Multiple fibers or other paths may be used that each support inputs and outputs. A combination of such arrangements may be used if desired.

In the example of FIG. 28, optical input signals from the core 336 of the left-hand fiber 308 may be coupled into waveguide 372. Waveguide 372 may transmit light from fiber 308 into detector 356. Detector 356 may be, for example, a silicon p-i-n diode formed from the substrate of hybrid integrated circuit 300. Detector 356 converts optical signals into electrical signals for the circuitry of hybrid integrated circuit 300.

Electrical signals from the circuitry of hybrid integrated circuit 300 may be provided to optical source 362. Source 362 may be, e.g., a GaAs laser diode that has been formed from a layer of compound semiconductor (i.e., GaAs) on a silicon substrate as described above. Source 362 converts the electrical signals into optical signals that are provided to the fiber core 336 of the right-hand optical fiber 308 using waveguide 374. If desired, the waveguides such as waveguides 374 and the other waveguides described herein may, in some suitable configurations, be shortened or eliminated or otherwise integrated into the sources and detectors being used. For example, if the output end of source laser 362 is formed on the edge of hybrid integrated circuit 308 of FIG. 28, waveguide 374 need not be used.

Figure 29:
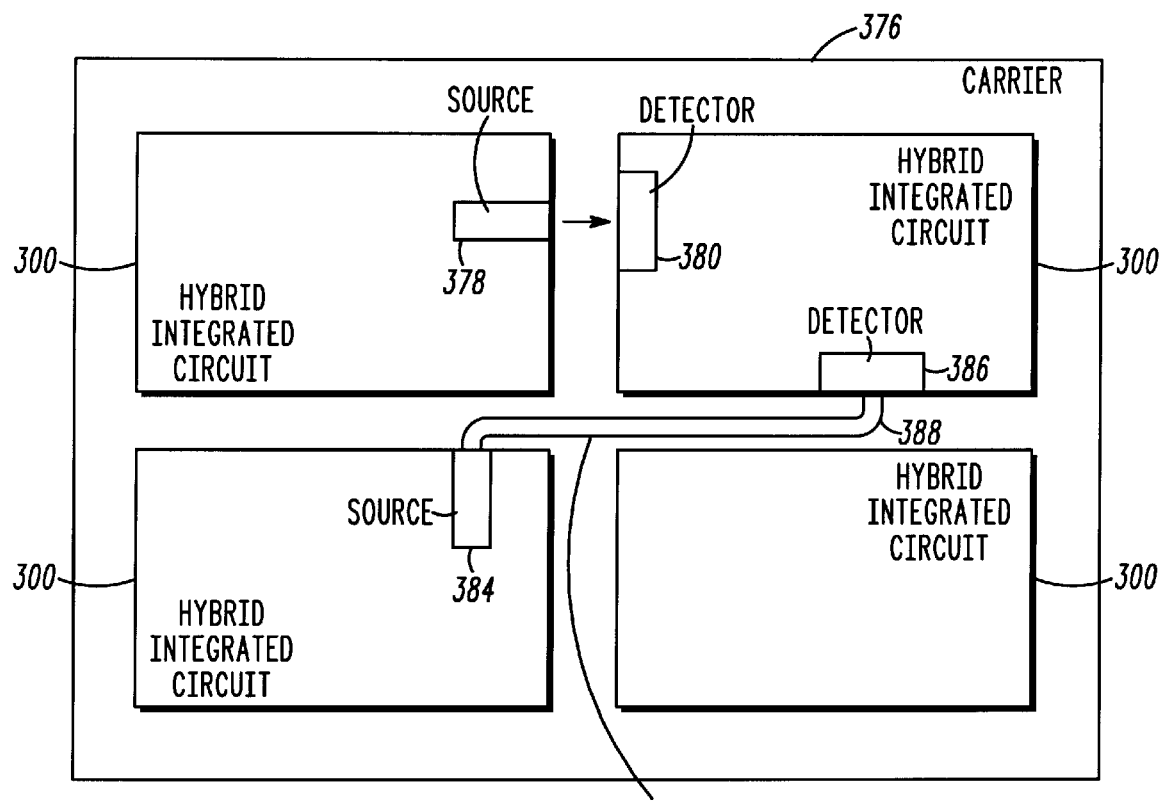
FIG. 29 is a diagram showing how hybrid integrated circuits mounted on a carrier may communicate using free-space links or optical waveguide links in accordance with the present invention.

As shown in FIG. 29, hybrid integrated circuits 300 may be mounted on a printed circuit board or other suitable carrier (e.g., a ceramic carrier, etc.). Hybrid integrated circuits that are mounted on such carriers may communicate over fiber-optic paths. If desired, hybrid integrated circuits 300 may communicate over free-space links or may communicate using integrated optical waveguide paths. For example, the upper-left hybrid integrated circuit 300 of FIG. 29 may use source 378 to communicate with detector 380 of the upper-right hybrid integrated circuit 300 over free-space link 382. The lower-left hybrid integrated circuit 300 of FIG. 29 may use source 384 to communicate with detector 386 of the upper-right hybrid integrated circuit 300 over optical waveguide 388.

Optical waveguides such as optical waveguide 388 may be formed from any suitable optical material. For example, optical waveguides may be formed from polymers such as polyimide or the like or may be formed from glasses or other optically-transparent materials. If desired, optical waveguides may be formed on carrier 376 (e.g., by patterning them using semiconductor fabrication techniques, silk screening, selective exposure to ultraviolet radiation followed by chemical processing, or any other suitable techniques).

Optical fiber paths, free-space paths, and optical waveguide paths may be used in any suitable combination.

Figure 30:
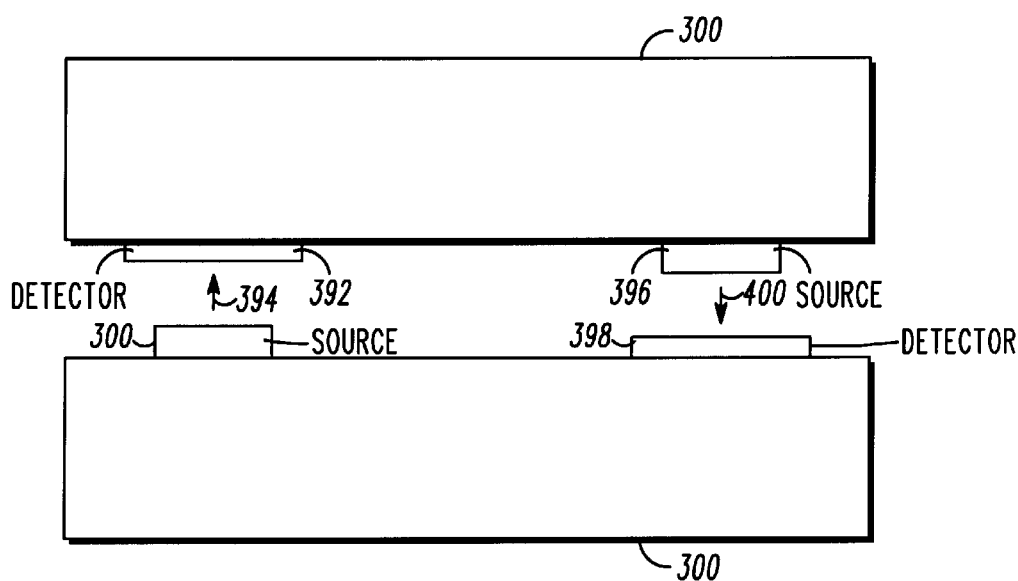
FIG. 30 is a diagram showing how vertically opposing hybrid integrated circuits may communicate using free-space optical links in accordance with the present invention.

Hybrid integrated circuits 300 may be placed in opposition to each other, as shown in FIG. 30. With arrangements such as these, hybrid integrated circuits 300 may communicate from source to detector over free-space links. For example, source 390 may transmit optical signals to detector 392 over free-space optical link 394. Source 396 may transmit optical signals to detector 398 over free-space optical link 400.

Figure 31:
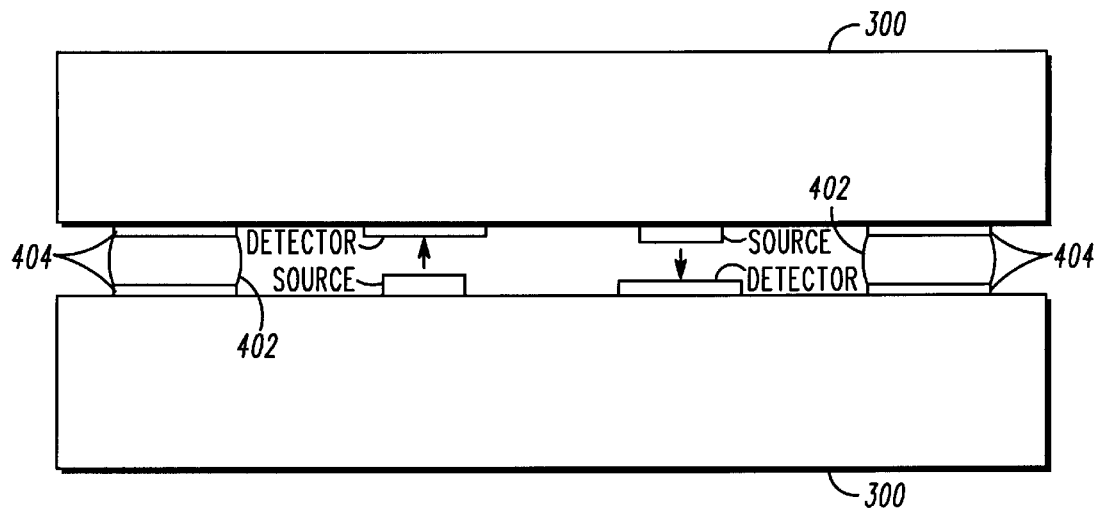
FIG. 31 is a diagram showing how flip-chip solder-bump techniques may be used to align opposing hybrid integrated circuits that communicate over free-space optical links in accordance with the present invention.

Sources and detectors may be aligned using any suitable technique. For example, standard flip-chip packaging techniques may be used to align upper and lower hybrid integrated circuits. As shown in FIG. 31, solder balls 402 may be provided to electrically and mechanically connect opposing pads 404. When the solder balls are heated, the surface tension of the molten solder tends to align the opposing hybrid integrated circuits. After the solder has cooled, the sources and detectors on the hybrid integrated circuit are aligned.

Figure 32:
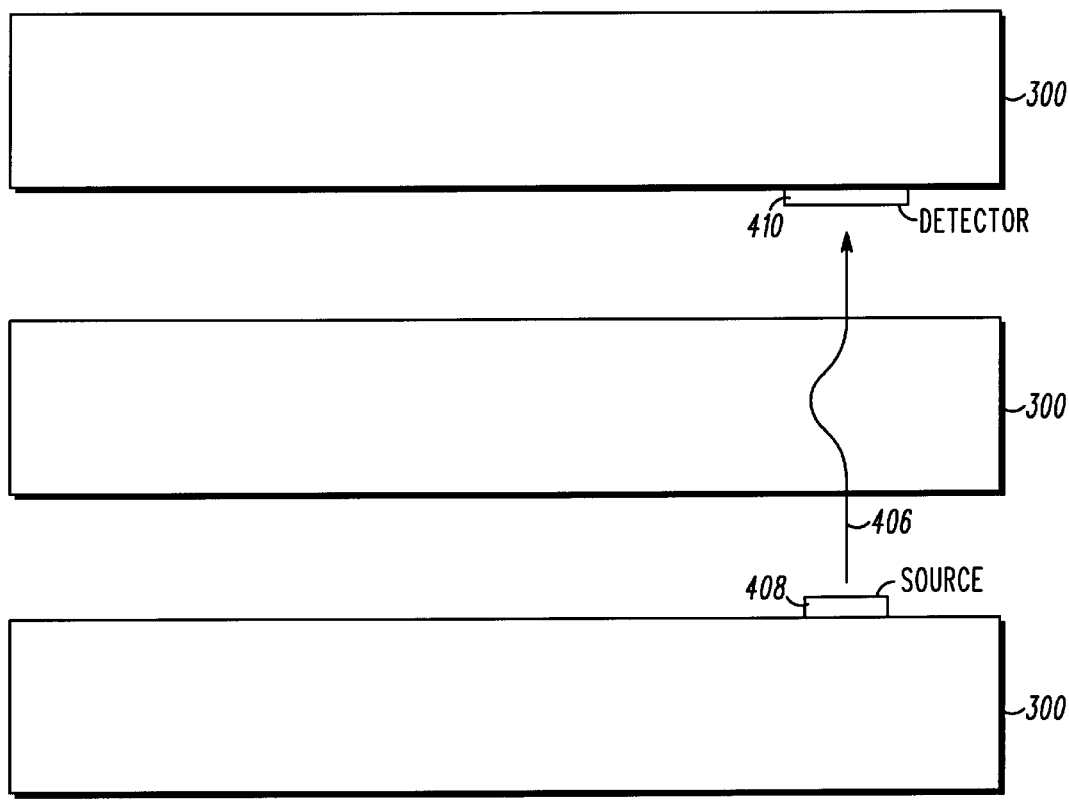
FIG. 32 is a diagram showing how optical links between hybrid integrated circuits may pass through the substrate of an intervening integrated circuit in accordance with the present invention.

Three or more hybrid integrated circuits may be vertically stacked. Vias may be provided in intermediate hybrid integrated circuits to create a free-space path between non-adjacent hybrid integrated circuits. Non-adjacent hybrid integrated circuits may also transmit optical signals through solid intervening substrates. An illustrative arrangement in which a lower hybrid integrated circuit 300 may optically communicate with an upper hybrid integrated circuit 300 through the substrate of an intermediate hybrid integrated circuit 300 or other integrated circuit is shown in FIG. 32. In the arrangement of FIG. 32, light 406 is emitted by source 408 of the lower hybrid integrated circuitry 300, passes through the substrate of the intermediate hybrid integrated circuit 300, and is detected by detector 410 of the upper hybrid integrated circuit 300. Source 408 and detector 410 may, for example, be formed from compound semiconductor layers based on InP. With this approach, light 406 may have a wavelength of approximately 1.3 microns. Substrate materials such as silicon transmit light at this wavelength, so a substantial fraction of the light from source 408 may pass to detector 410 through the substrate of the intermediate hybrid integrated circuit.

Figure 33:
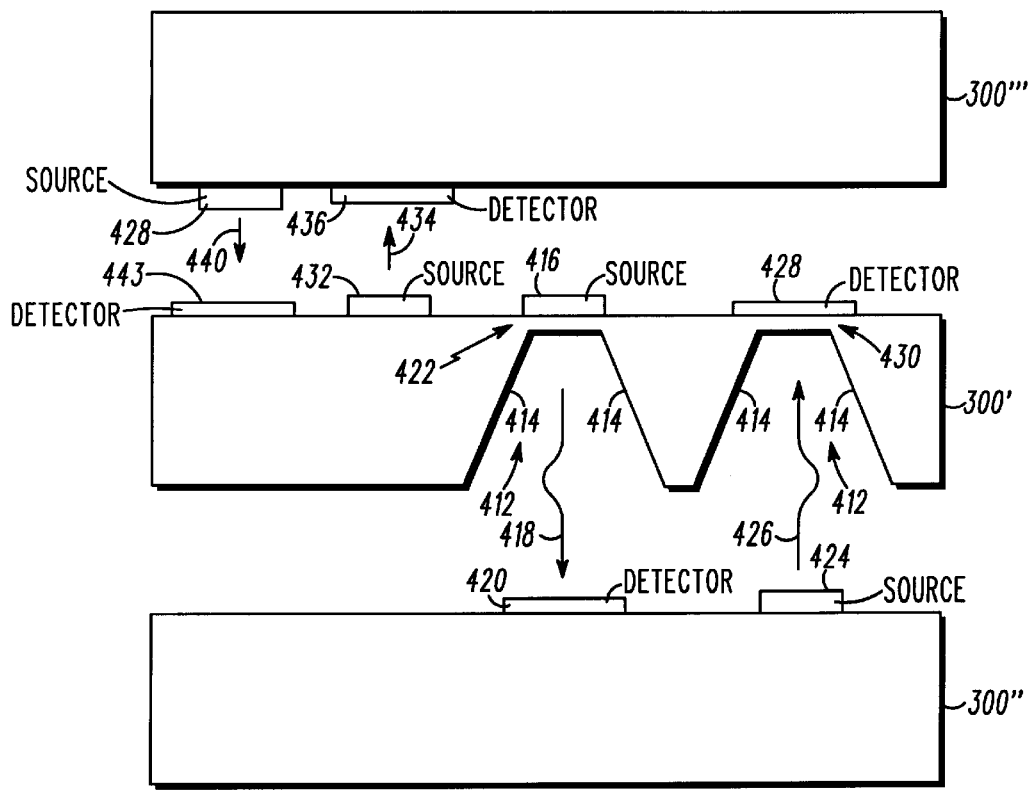
FIG. 33 is a diagram showing how backside via holes may be created in a hybrid integrated circuit to accommodate sources and detectors for optical communications between hybrid integrated circuits in accordance with the present invention.

If desired, some or all of the substrate beneath the sources and detectors on hybrid integrated circuits 300 may be removed to facilitate free-space optical communications. As shown in FIG. 33, for example, holes 412 may be formed in the substrate of hybrid integrated circuit 300'. Sidewalls 414 of holes 412 may be angled as shown in FIG. 28 due to the use of anisotropic wet etching. If desired, holes 412 may be formed using reactive ion etching or any other suitable technique for forming wafer vias or holes. The accommodating layer, which may be formed from strontium titanate or other relatively unreactive materials, may be used as an etch stop at the top of the vias or holes (e.g., during wet etching or gas etching, etc.).

With the arrangement of FIG. 33, source 424 of hybrid integrated circuitry 300" may transmit light 426 to detector 428 of hybrid integrated circuit 300' through gap 430. If gap 430 is thin, some optical absorption at the wavelength of light 426 may be acceptable, even if gap 430 is not an electrically active portion of detector 428.

Signals from hybrid integrated circuit 300' may be transmitted to hybrid integrated circuit 300" using source 416. Source 416 may be a downwardly-directed vertical cavity laser diode. Source 416 may transmit light 418 to detector 420 through gap 422 in the substrate of hybrid integrated circuit 300'. If gap 422 is thin, some optical absorption at the wavelength of light 418 may be acceptable, provided that a sufficiently strong optical signal is transmitted to detector 420. Sources such as sources 424 and 416 and the other sources described herein may be formed from the compound semiconductor layer. Detectors such as detectors 420 and 428 and the other detectors described herein may be formed from the compound semiconductor layer or from the monocrystalline substrate (depending on the desired wavelength of operation and other considerations).

Hybrid integrated circuit 300' may communicate with hybrid circuit 300''' using the same arrangements used to interconnect hybrid integrated circuit 300' and hybrid integrated circuit 300''. If desired, hybrid integrated circuit 300' and hybrid integrated circuit 300''' may communicate using surface structures, rather than using structures that involve the creation of underlying holes of vias. In particular, source 432 may be used to send optical signals 434 to detector 436 and source 438 may be used to send optical signals 440 to detector 442. Combinations of hole-based and non-hole-based detectors and sources may be used if desired. Moreover, through-holes may be provided in intermediate hybrid integrated circuits to provide a free-space optical communications path between non-adjacent hybrid integrated circuits.

Figure 34:
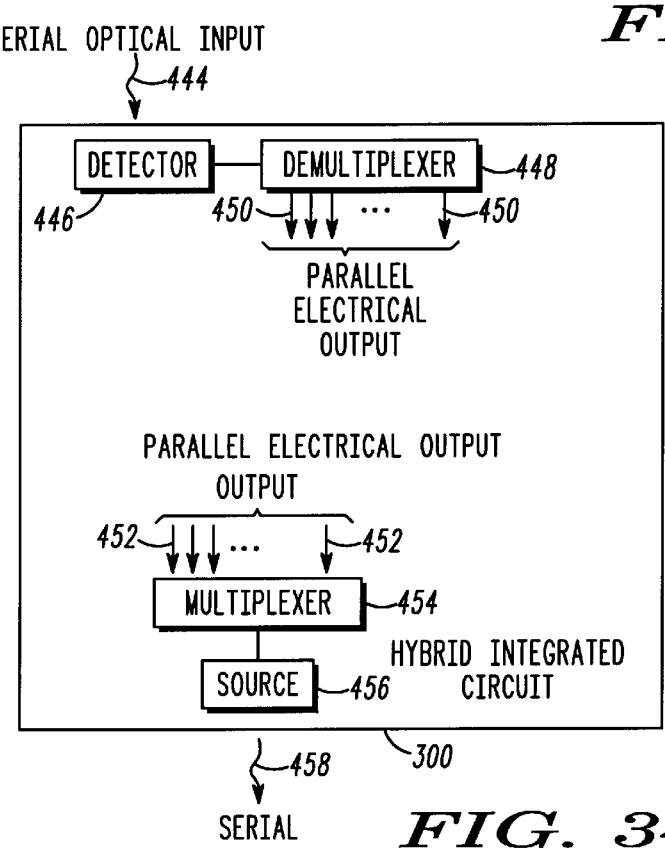
FIG. 34 is a diagram showing how a hybrid integrated circuit may demultiplex serial optical signals that are received into parallel electrical signals before electrical processing and may multiplex parallel electrical signals before transmission as serial optical signals in accordance with the present invention.

An optical port with even a single laser diode on a hybrid integrated circuit 300 may have a relatively high bandwidth. Accordingly, the optical signal streams between hybrid integrated circuits 300 that are based on single light streams may often be used to carry information that is otherwise handled using multiple electrical connectors or lines. As shown in FIG. 34, a serial optical input signal 444 may be detected by optical detector 446. The serial data stream from optical detector 446 may be demultiplexed into multiple parallel electrical outputs 450 using demultiplexer 448. The circuitry on hybrid integrated circuit 300 uses the demultiplexed signals from demultiplexer 448 as inputs and provides corresponding output signals onto parallel lines 452. The parallel electrical signals on line 452 may be multiplexed by multiplexer 454 to form a single high-bandwidth data stream that is used to modulate source 456. Source 456 may transmit high-bandwidth optical signals 458 to detectors on other hybrid integrated circuits or the like.

Figure 35:
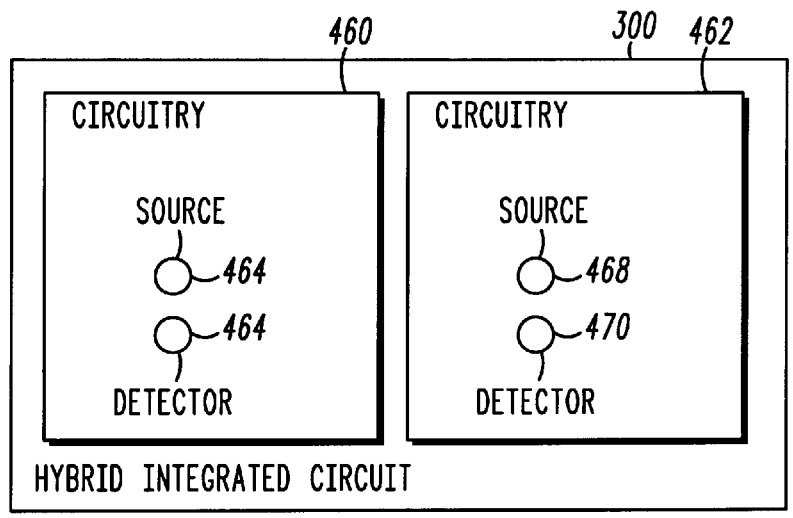
FIG. 35 is a diagram showing how multiple sources and detectors may be used on a hybrid integrated circuit to support communications with different regions on the integrated circuit in accordance with the present invention.

If desired, optical sources and detectors may be provided in multiple areas or regions on hybrid integrated circuit 300. This allows different regions of the hybrid integrated circuit to be serviced by different transmitter/receivers, which may reduce signal path lengths and the delays associated with these path lengths. As shown in FIG. 35, for example, circuitry region 460 may be served exclusively or primarily by source 464 and detector 466, whereas circuitry region 462 may be served exclusively or primarily by source 468 and detector 470. Any suitable number of sources and detectors may be used.

Using optical input/output port configurations based on the fiber-optic, free-space, and waveguide interconnection arrangements described above, may allow a large amount of data to be provided to a hybrid integrated circuit in a relatively short time period. This may facilitate the reloading or reconfiguration of reconfigurable electronic devices such as memory, programmable logic devices, microprocessors, digital signal processors, input/output circuits, or any other suitable electronic device that may be reconfigured based on the data that is provided to the device.

Figure 36:
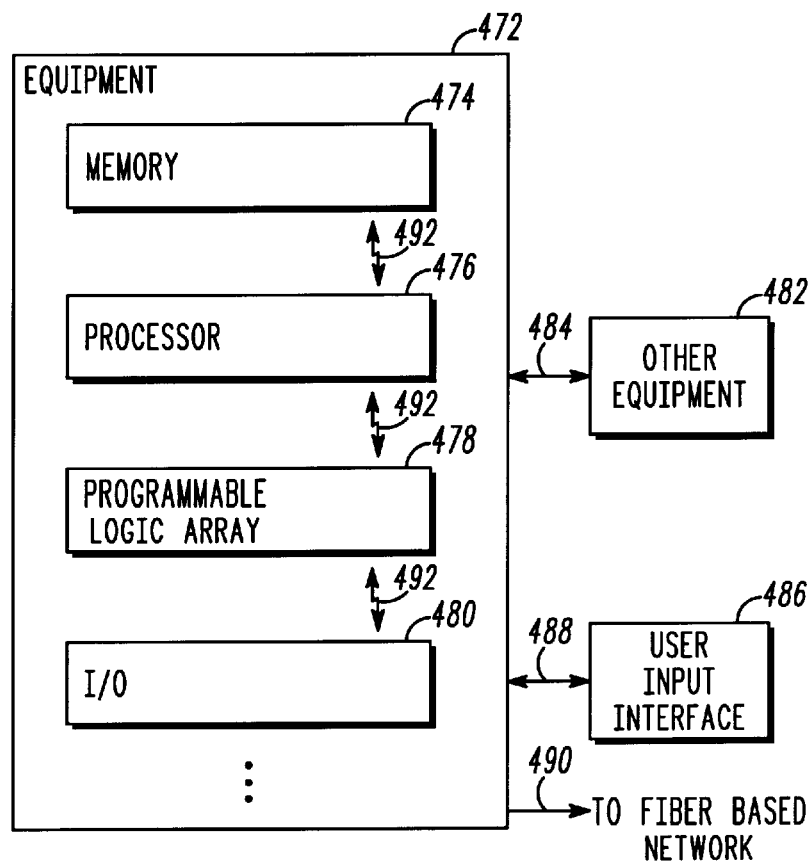
FIG. 36 is a schematic diagram showing how various components of a electronic system that are based on hybrid integrated circuits may communicate using optical communications in accordance with the present invention.

Illustrative electrical equipment 472 that includes electrical components that may be based on hybrid integrated circuits 300 is shown in FIG. 36. Equipment 472 may include memory 474 (e.g., random-access memory such as static random-access memory and dynamic random-access memory, read-only memory, a fast hard drive or other storage device, etc.), a processor 476 (e.g., a microprocessor), a programmable logic array 478, an input/output circuit 480, and other suitable integrated circuits. Some or all of the components of equipment 472 may be integrated circuits such as hybrid integrated circuits with optical ports capable of supporting optical communications over optical paths 492. Optical paths 492 may be free-space paths, fiber-optic paths, waveguide paths, or any other suitable optical paths. Electrical paths may also be provided between the components of equipment 472.

Equipment 472 may communicate with other equipment 482 over communications path 484. Path 484 may be an optical path or an electrical path or may involve a combination of optical and electrical paths. If equipment 472 is a computer, equipment 482 may be a peripheral device such as a printer or scanner. If equipment 472 is a controller, equipment 482 may be industrial equipment containing motors and other such components. If equipment 472 is a consumer electronics device such as a set-top box or stereo system, equipment 482 may be another consumer electronics device such as a television or tape player. These are merely illustrative examples.

If equipment 472 is controllable by a user, a user input interface 486 may be connected to equipment 472 by communications path 488. Communications path 488 may be an optical communications path, an electrical communications path, or a combination of optical and electrical communications paths. A user may use the user input interface to interact with equipment 472.

Equipment 472 may communicate with a network over electrical and optical paths. For example, optical communications between the components of equipment 472 and a fiber-based network may be supported using optical fiber 490. If desired, optical fiber 490 may be connected to one of the hybrid integrated circuits in equipment 472.

Figure 37:
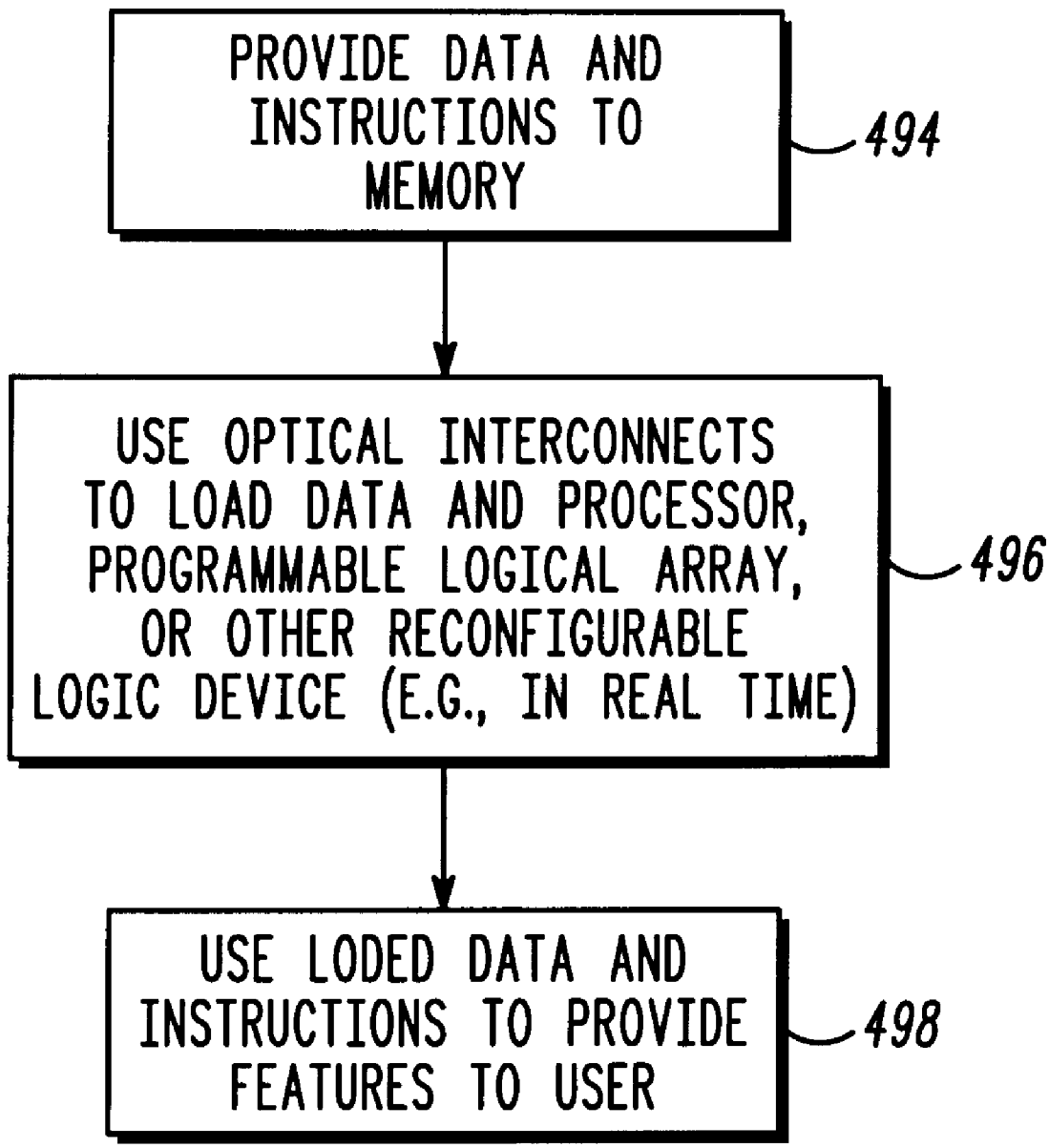
FIG. 37 is a flow chart of illustrative steps involved in using optical interconnects to load data and instructions into a hybrid integrated circuit in accordance with the present invention.

Some or all of the paths 492 between the components of equipment 472 may be wide-bandwidth optical paths that using the hybrid integrated circuit optical input/output port arrangements described above. Illustrative steps involved in using wide-bandwidth optical communications ports to rapidly reconfigure the data used by equipment 472 during operation are shown in FIG. 37. At step 494, data and instructions (which may be considered to be a type of data) may be provided to memory 474. For example, software applications, microcode for the processor, configuration data for the programmable logic array, data for a digital signal processor or application-specific integrated circuit, or any other suitable data and instructions for use by the hybrid integrated circuit components of equipment 472 may be provided to memory 474. Data and instructions may be provided to memory 474 from a storage device such as a hard disk drive or an optical disk, may be loaded from a network (e.g., over path 490 or an electrical network connection), or may be provided from equipment such as equipment 482.

At step 496, optical paths 492 may be used to load data and instructions from memory 474 or from any other suitable component or storage location into the components of equipment 472. For example, instructions and data associated with an application program may be rapidly loaded into cache memory on processor 476 or into fast random-access memory fabricated on a hybrid integrated circuit over a wide-bandwidth optical communications port that uses the optical input/output structures described above. Because the ports used for transmitting and receiving optical signals have a wide bandwidth, application programs may be loaded significantly faster than with low-bandwidth electrical input/output port arrangements.

The loading of application programs is merely one illustrative example of the type of loading operation that may be accelerated using a hybrid integrated circuit optical communications port. Other examples include loading new microcode for processor 476, loading new configuration data for programmable logic array 478, loading new data for a digital signal processor or application-specific integrated circuit, loading new parameters for use by input/output device 480, etc. The data and instructions may be loaded by transferring the data and instructions to any suitable memory or other circuitry on the reconfigurable component to which the data and instructions are being provided. For example, data and instructions that are provided to a microprocessor may be loaded into cache memory (e.g., level one or level two cache memory) on the processor, configuration data for a programmable logic device may be loaded into the programming registers on the device, etc.

At step 498, the relevant components may use the newly loaded data and instructions. Because the loading operation is rapid, the newly loaded data and instructions may be loaded and used in real time if desired.

The approach of FIG. 37 may allow processors to switch between application programs with negligible loading delays. It may also allow programmable logic arrays, digital signal processors, application specific integrated circuits, and other devices to be reconfigured on the fly to handle various computational tasks. The new data and instructions may allow microprocessors and dedicated signal processors and the like to rapidly change from (for example) supporting one type of video compression scheme to another type of video compression scheme. These are merely illustrative examples, any suitable reconfigurable components based on hybrid integrated circuits may be used in equipment 472 and these components may be reconfigured in any suitable way by rapidly loading data and instructions through high-bandwidth optical communications ports.

The foregoing is merely illustrative of the principles of this invention and various modifications can be made by those skilled in the art without departing from the scope and spirit of the invention.

What is claimed is:

1. Electronic equipment comprising:
   a first electrical component on which data is stored; and
   a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein an optical component that is formed using the compound layer is used to form an optical communications port on the hybrid integrated circuit, and wherein the data form the first electrical component is loaded onto the second electrical component using the optical communications port of the second electrical component and is used by the electrical circuitry, wherein the first electrical component is a memory.

2. The equipment defined in claim 1 wherein the optical component on the second electrical component is an optical source.

3. The equipment defined in claim 1 wherein the optical component on the second electrical component is an optical detector.

4. The equipment defined in claim 1 wherein the first electrical component is based on a hybrid integrated circuit having a monocrystalline semiconductor substrate in which electrical circuitry is formed, an accommodating layer formed on the substrate, and at least one compound semiconductor layer on the accommodating layer, wherein an optical component that is formed using the compound semiconductor layer on the first electrical component is used to form an optical communications port on the first electrical component, and wherein the data from the first electrical component is loaded onto the hybrid integrated circuit of the second electrical component from the hybrid integrated circuit of the first electrical component using both the optical communications port on the first electrical component and the optical communications port on the second electrical component.

5. The equipment defined in claim 1 wherein the optical communications port of the second electrical component receives optical signals from the first electrical component over a free-space optical communications path.

6. The equipment defined in claim 1 further comprising an optical fiber path between the first electrical component and the optical communications port of the second electrical component.

7. The equipment defined in claim 1 further comprising:
   a carrier on which the first and second electrical components are mounted; and
   an optical waveguide path between the first and second electrical components.

8. The equipment defined in claim 1 wherein the compound semiconductor layer includes gallium arsenide and the monocrystalline semiconductor includes silicon.

9. Electronic equipment comprising:
   a first electrical component on which data is stored; and
   a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data form the first electrical component is loaded onto the second electrical component using the optical communications port of the second electrical component and is used by the electrical circuitry wherein the moncrystalline semiconductor substrate has a via hole under the optical component.

10. Electronic equipment comprising:
    a first electrical component on which data is stored; and
    a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein the optical component that is formed using the compound semiconductor layer is used to form an optical communications port on the hybrid integrated circuit, and wherein the data from the first electrical component is loaded onto the second electrical component using the optical communications port of the second electrical component and is used by the electrical circuitry wherein the first and second components are vertically stacked.

11. Electronic equipment comprising:

a first electrical component on which data is stored; and a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer is used to form an optical communications port on the hybrid integrated circuit, and wherein the data from the first electrical component is loaded onto the second electrical component using the optical communications port of the second electrical component and is used by the electrical circuitry wherein multiple components including the first and second optical components are vertically stacked and wherein at least two of these components are configured to communicate optically using light that passes through an intermediate one of the multiple optical components.

12. Electronic equipment comprising:

a first electrical component on which data is stored; and a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data from the first electrical component is loaded onto the second electrical component using the optical communications port of the second electrical component and is used by the electrical circuitry wherein the second electronic component is a processor that receives new microcode through the optical communications port in real time.

13. Electrical equipment comprising:

a first electrical component on which data is stored; and a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data form the first electrical component is loaded onto the second electrical component using the optical communications port of the second electrical component and is used by the electrical circuitry wherein the second electronic component is a programmable logic array.

14. Electronic equipment comprising:

a first electrical component on which data is stored; and a second electrical component including a hybrid integrated circuit that is separate from the first electrical component and that has a monocrystalline semiconductor substrate in which the first electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data from the first electrical component is loaded onto the second electrical component using the optical communications port of the second electrical component and is used by the electrical circuitry wherein the first electronic component is a memory and the second electronic component is a processor and wherein the compound semiconductor layer includes gallium arsenide and the monocrystalline semiconductor layer includes silicon.

15. Electronic equipment comprising:

a first electrical component on which data is stored; and a second electrical component including a hybrid integrated circuit that is separate from the first electrical component and that has a monocrystalline semiconductor substrate in which electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data form the first electrical component is loaded onto the second electrical component using the optical communications port of the second electrical component and is used by the electrical circuitry wherein the first electrical component includes a hybrid integrated circuit and wherein the first and second electrical components are mounted in opposition to each other and are separated by solder bumps.

16. Electronic equipment comprising:

a first electrical component on which data is stored; and a second electrical component including a hybrid integrated circuit that is separate form the first electrical component and that has a monocrystalline semiconductor substrate in which electrical circuitry is formed, an accommodating layer formed on the substrate, and at least one compound semiconductor layer on the accommodating layer, wherein an optical component that is formed using the compound semiconductor layer is used to form an optical communications port on the hybrid integrated circuit, and wherein the data from the first electrical component is loaded onto the second electrical component using the optical communications port of the second electrical component and is used by the electrical circuitry wherein the first electrical component includes a hybrid integrated circuit and wherein the first and second electrical components are mounted in opposition to each other and are separated by solder bumps, such that an optical source on the first electrical component is optically aligned with an optical detector in the optical communications port on the second electrical component.

17. A hybrid integrated circuit that uses data to operate and that may be reconfigured by providing new data, comprising:

a monocrystalline semiconductor substrate in which electrical circuitry is formed;

an accommodating layer formed on the substrate; and at least one compound semiconductor layer on the accommodating layer; wherein an optical component that is formed using the compound semiconductor layer is used to form an optical communications port on the hybrid integrated circuit, and wherein the optical communications port is used to load new data to reconfirm that hybrid integrated circuit and wherein the accommodating layer includes strontium titanate.

18. The hybrid integrated circuit defined in claim 17 wherein the optical port includes an optical source and an optical detector.

19. The hybrid integrated circuit defined in claim 17 further comprising:
   at least a first optical source and optical detector and a second optical source and optical detector; and
   at least two regions of circuitry, wherein one of the regions of circuitry is served by the first optical source and detector and the other region of circuitry is served by the second optical source and detector.

20. The hybrid integrated circuit defined in claim 17 wherein the optical component includes a gallium arsenide laser.

21. The hybrid integrated circuit defined in claim 17 wherein the optical communications port includes a semiconductor laser.

22. The hybrid integrated circuit defined in claim 17 wherein the optical communications port includes a vertical cavity semiconductor laser.

23. A hybrid integrated circuit that uses data to operate and that may be reconfigured by providing new data, comprising:
   a monocrystalline semiconductor substrate in which electrical circuitry is formed;
   an accommodating layer formed on the substrate; and
   at least one compound semiconductor layer on the accommodating layer; wherein an optical component that is formed using the compound semiconductor layer is used to form an optical communications port on the hybrid circuit, and wherein the optical communications port is used to loan new data to reconfigure the hybrid integrated circuit and further wherein the optical communications port is configured for coupling to a single optical fiber that handles input and output optical signals.

24. The hybrid integrated circuit defined in claim 17 wherein the optical communications port is configured for coupling to at least two optical fibers.

25. The hybrid integrated circuit defined in claim 17 wherein the optical communications port is configured for coupling to an optical fiber using a vertical coupling arrangement.

26. The hybrid integrated circuit defined in claim 17 wherein the optical communications port is configured for coupling to an optical fiber using a horizontal fiber coupling arrangement.

27. The hybrid integrated circuit defined in claim 17 further comprising at least one optical waveguide for carrying optical signals.

28. A hybrid integrated circuit that uses data to operate and that may be reconfigured by providing new data, comprising:
   a monocrystalline semiconductor substrate in which electrical circuitry is formed;
   an accommodating layer formed on the substrate; and
   at least one compound semiconductor layer on the accommodating layer; wherein an optical component that is formed using the compound semiconductor layer is used to form and optical communications port on the hybrid integrated circuit, and wherein the optical communications port is used to loan new data to reconfigure the hybrid integrated circuit wherein said circuit further comprises at least one optical grating.

29. The hybrid integrated circuit defined in claim 17 wherein the optical communications port includes a silicon detector for detecting optical signals from an optical fiber.

30. The equipment defined in claim 1, wherein the monocrystalline semiconductor substrate is made of silicon having a (100) orientation.

31. The circuit defined in claim 17, wherein the monocrystalliine semiconductor substrate is made of silicon having a (100) orientation.

32. The equipment defined in claim 1, wherein said optical communications port comprises a light emitting diode.

33. The circuit defined in claim 17, wherein said optical communications port comprises a light emitting diode.

* * * * *